(12) United States Patent
Ooshima et al.

(10) Patent No.: US 6,856,494 B2
(45) Date of Patent: Feb. 15, 2005

(54) SPIN-VALVE TYPE THIN FILM MAGNETIC ELEMENT HAVING BIAS LAYERS AND FERROMAGNETIC LAYERS

(75) Inventors: Masahiro Ooshima, Niigata-ken (JP); Eiji Umetsu, Niigata-ken (JP); Masamichi Saito, Niigata-ken (JP); Kenichi Tanaka, Tokyo (JP); Naoya Hasegawa, Niigata-ken (JP); Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 268 days.

(21) Appl. No.: 09/885,871

(22) Filed: Jun. 20, 2001

(65) Prior Publication Data

US 2002/0024781 A1 Feb. 28, 2002

Related U.S. Application Data

(63) Continuation-in-part of application No. 09/814,531, filed on Mar. 21, 2001, now abandoned.

(30) Foreign Application Priority Data

Mar. 24, 2000 (JP) ........................................ 2000-085287
Mar. 23, 2001 (JP) ........................................ 2001-086261

(51) Int. Cl.[7] ............................. G11B 5/127; G11B 5/33
(52) U.S. Cl. ................................................. 360/324.12
(58) Field of Search ..................... 360/324.12, 324.1, 360/324, 317, 313, 110, 327.3, 327.32

(56) References Cited

U.S. PATENT DOCUMENTS

| 5,492,720 | A | 2/1996 | Gill et al. |
| 5,508,866 | A | 4/1996 | Gill et al. |
| 5,528,440 | A | 6/1996 | Fontana et al. |
| 5,691,864 | A | 11/1997 | Saito |
| 5,696,654 | A | 12/1997 | Gill et al. |
| 5,768,067 | A | 6/1998 | Saito et al. |
| 5,972,420 | A | 10/1999 | Saito et al. |
| 6,266,218 | B1 * | 7/2001 | Carey et al. ........... 360/324.12 |
| 6,275,363 | B1 * | 8/2001 | Gill ........................ 360/324.2 |
| 6,462,919 | B1 * | 10/2002 | Mack et al. ............. 360/327.3 |
| 2001/0028537 | A1 * | 10/2001 | Gill ........................... 360/314 |

FOREIGN PATENT DOCUMENTS

| JP | 10-112562 | 4/1998 |
| JP | 11-266044 | 9/1999 |
| JP | 2000-040211 | 2/2000 |
| JP | 87455 B1 | 5/2004 |

* cited by examiner

Primary Examiner—Julie Anne Watko
(74) Attorney, Agent, or Firm—Brinks Hofer Gilson & Lione

(57) ABSTRACT

The present invention provides a spin-valve type thin film magnetic element that is able to certainly align the magnetization direction of the free magnetic layer in one direction by improving the exchange coupling magnetic field generated between the bias layers and ferromagnetic layer, and is able to reduce the thickness of the bias layer to be smaller than the thickness of the bias layer of the conventional spin-valve type thin film magnetic element for obtaining the same magnitude of the exchange coupling magnetic layer as that in the conventional spin-valve type thin film magnetic element.

16 Claims, 10 Drawing Sheets

SPIN-VALVE TYPE THIN FILM MAGNETIC ELEMENT HAVING BIAS LAYERS AND FERROMAGNETIC LAYERS

This application is a continuation-in-part of U.S. patent application Ser. No. 09/814,531, filed Mar. 21, 2001 (abandoned).

BACKGROUND OF THE INVENTION

1. Field of the Invention

The present invention relates to a spin-valve type thin film magnetic element in which electrical resistance changes in relation to the direction of pinned magnetization of a pinned magnetic layer and the direction of magnetization of a free magnetic layer susceptible to external magnetic fields, and a thin film magnetic head comprising the spin-valve type thin film magnetic element.

2. Description of the Related Art

Magnetoresistive magnetic heads are categorized as an AMR (Anisotropic Magnetoresistive) head comprising an element that exhibits a magnetoresistive effect and a GMR (Giant Magnetoresistive) head comprising an element that exhibits a giant magnetoresistive effect. The Element that exhibits the magnetoresistive effect in the AMR head comprises a monolayer structure made of a magnetic material. The element in the GMR head comprises, on the other hand, a multilayer structure of a plurality of laminated materials. Among several structures that yield the giant magnetoresistive effect, a spin-valve type thin film magnetic element has a relatively simple structure and high rate of change of resistivity against weak external magnetic fields.

FIG. 9 shows a cross section of one example of the structure of the conventional spin-valve type thin film magnetic element viewed from the opposite face side to a recording medium.

Shield layers are formed on and under the spin-valve type thin film magnetic element 30 in this example separated by gap layers (insulation layers), and a regenerative GMR head is composed of the spin-valve type thin film magnetic element 30, gap layers and shield layers. A recording inductive head may be laminated on the regenerative GMR head.

This GMR head as well as the inductive head are provided at the end of the trailing side of a floating type slider to sense the recorded magnetic field of a magnetic recording medium such as a hard disk.

In FIG. 9, the magnetic recording medium travels in the Z direction in the drawing, and the leakage magnetic field from the magnetic recording medium is directed in the Y-axis in the drawing.

The spin-valve type thin film magnetic element 30 shown in FIG. 9 is a so-called bottom type single spin-valve type thin film magnetic element in which one layer each of an antiferromagnetic layer, a pinned magnetic layer, a non-magnetic conductive layer and a free magnetic layer are formed.

In FIG. 9, the reference numeral 33 denotes a lower shield layer with a lower gap layer (an insulation layer) 31 formed on this lower shield layer 33, and an antiferromagnetic layer 22 is formed on the gap layer 31. In addition, a pinned magnetic layer 23 is formed on the antiferromagnetic layer 22, a non-magnetic conductive layer 24 made of, for example, Cu is formed on the pinned magnetic layer 23, and a free magnetic layer 25 is formed on the non-magnetic conductive layer 24.

A pair of bias layers 26, 26 are laminated on the free magnetic layer 25 separated by a pair of ferromagnetic layers 27, 27 made of, for example, a NiFe alloy with a distance apart in the X1 direction in the drawing. A pair of conductive layers 28, 28 made of, for example, Cu are further provided on the bias layers 26, 26.

A gap layer 32 covering the conductive layers 28, 28 and free magnetic layer 25 and made of $Al_2O_3$ is additionally laminated on the conductive layers.

A shield layer (an upper shield layer) 34 is laminated on the gap layer (the upper gap layer) 32.

The antiferromagnetic layer 22 made of an antiferromagnetic material such as a FeMn alloy is laminated to be in contact with the pinned magnetic layer 23 so that an exchange coupling magnetic field (an exchange anisotropic magnetic field) is generated at the interface between the pinned magnetic layer 23 and antiferromagnetic layer 22 to fix the magnetization direction of the pinned magnetic layer 23 in the Y direction in the drawing, or in the direction departing from the recording medium (the height direction).

The pinned magnetic layer 23 is made of, for example, a Co film, a NiFe alloy, CoNiFe alloy or CoFe alloy.

The bias layers 26, 26 made of an antiferromagnetic material such as an IrMn alloy are laminated in contact with the antiferromagnetic layers 27, 27, and generate an exchange coupling magnetic field (an exchange anisotropic magnetic field) at the interface between the bias layers 26 and antiferromagnetic layers 27. The magnetization direction of the free magnetic layer 25 is aligned in the direction opposed to the X1 direction in the drawing by this exchange coupling magnetic field to suppress Barkhausen noises by putting the free magnetic layer 25 into a single magnetic domain state, thereby allowing the magnetization direction of the free magnetic layer 26 to be approximately perpendicular to the magnetization direction of the pinned magnetic layer 23.

Since a pair of the bias layers 26 and 26 are laminated with a distance apart with each other, a portion that is not laminated with the bias layer 26 remains on the free magnetic layer 25, and this portion serves as a track portion G2 of the thin film magnetic head.

The magnetization direction of the free magnetic layer shifts from the direction opposed to the X1 direction to the Y direction in this spin-valve type thin film magnetic element 30, when a steady-state current flows from the conductive layer 28 to the free magnetic layer 25, non-magnetic conductive layer 24 and pinned magnetic layer 23, and when a leakage magnetic field is applied in the Y direction from the magnetic recording medium traveling in the Z direction. The electric resistance changes in relation to the change of the magnetization direction in the free magnetic layer 25 and the magnetization direction of the pinned magnetic layer 23, and the leakage magnetic field from the magnetic recording medium is sensed by voltage changes based on the resistance changes.

The spin-valve type thin film magnetic element 30 shown in FIG. 9 functions so as to align the magnetization direction of the free magnetic layer 25 so that it comes in substantially perpendicular the magnetization direction of the pinned magnetic layer 23 by an exchange bias method using the bias layer 26 made of an antiferromagnetic material.

The bias layers 26 and the antiferromagnetic layer 22 are formed using an antiferromagnetic material such as an InMn alloy that is susceptible to heat in the spin-valve type thin film magnetic element 30 shown in FIG. 9. Accordingly, the exchange coupling magnetic field (Hex) generated at the interface between the bias layer 26 and antiferromagnetic layer 27 decreases by a heat treatment at 200° C. or more in the manufacturing process of the spin-valve type thin film magnetic element, or by the heat generated by the steady-sate sensing current when the element is used as a magnetic head. Consequently, the pinning magnetic field of the exchange bias for aligning the magnetization direction of the free magnetic layer 26 in the direction opposed to the X1 direction is weakened, and magnetic domains of the free magnetic layer 25 are hardly controlled or the pinning magnetic field becomes unstable.

Since the bias layer 26 in the vicinity of the track portion 26a is thinned when the bias layers 26 and conductive layers 28 are formed by a so-called lift-off method, the exchange coupling magnetic field generated at the interface between the track portion 26a of the track layer 26 and the ferromagnetic layer 27 is decreased. The magnetization direction at the portion 27a in the vicinity of the ferromagnetic layers 27 is disturbed and fails in aligning in the direction opposed to the X1 direction. Consequently, the magnetization direction at the portion 25a at both sides of the track portion of the free magnetic layer 25 is not aligned in the opposed direction to the X1 direction, thereby generating an abnormal output waveform at both ends of the track width Tw.

The bias layer 26 should be as thick as about 50 nm in order to certainly align the magnetization direction of the free magnetic layer 25. In addition, since the conductive layers 28 are required to have some thickness in order to allow a sensing current to flow, a large step height 32a is formed in the vicinity of the track portion of the gap layer 32. Consequently, the shape of the writing magnetic gap of the recording inductive head laminated on the spin-valve type thin film magnetic element is distorted and the magnetic recording pattern recorded on the magnetic recording medium becomes irregular, possibly causing an error during regeneration. When the bias layers 26 and the conductive layers 28 are thick, on the other hand, the distance $L_1$ between these bias layers 26 and the conductive layers 28, and the upper shield layer 34 is shortened to make it difficult to securely insulate the shield layer 34 from the spin-valve type thin film magnetic element 3.

SUMMARY OF THE INVENTION

Accordingly, the object of the present invention for solving the problems described above is to provide a spin-valve type thin film magnetic element and a thin film magnetic head comprising the spin-valve type thin film magnetic element, wherein the magnetization direction of the free magnetic layer is certainly aligned in one direction by improving the exchange coupling magnetic field (Hex) generated at the interface between the bias layer comprising an antiferromagnetic material and the ferromagnetic layer, thereby improving stability of the output waveform at both ends of the track width. For obtaining an exchange coupling magnetic field (an exchange coupling magnetic field generated at the interface between the bias layer and ferromagnetic layer) having the same magnitude as that generated in the conventional spin-valve type thin film magnetic element, the thickness of the bias layer may be thinner than that in the conventional spin-valve type thin film magnetic element in the spin-valve type thin film magnetic element according to the present invention.

For attaining the foregoing object, the present invention provides a spin-valve type thin film magnetic element comprising a laminate comprising an antiferromagnetic layer, a pinned magnetic layer in contact with an antiferromagnetic layer in which the magnetization direction of the pinned magnetic layer is fixed by an exchange anisotropic magnetic field with the antiferromagnetic layer, and a non-magnetic conductive layer formed between the pinned magnetic layer and a free magnetic layer; bias layers for aligning the magnetization direction of the free magnetic layer in the direction substantially perpendicular to the magnetization direction of the pinned magnetic layer; ferromagnetic layers formed in contact with the bias layers; and conductive layers for applying a sensing current to the free magnetic layers.

Each of the ferromagnetic layers is divided into two sub-layers separated by a non-magnetic intermediate layer, the sub-layers being in a ferrimagnetic state in which the magnetization direction of one sub-layer is 180 degrees different from the magnetization direction of the other sub-layer.

An exchange coupling magnetic field (an exchange anisotropic magnetic field) is generated at the interface between one of the two ferromagnetic layers (the first ferromagnetic layer) in contact with the bias layer and the bias layer. The magnitude of the generated exchange coupling magnetic field according to the present invention is larger than the magnitude of the exchange coupling magnetic field generated at the interface between the bias layer and ferromagnetic layer of the conventional spin-valve type thin film magnetic element, even when the spin-valve type thin film magnetic element is heat-treated at 200° C. or more in the production process, or when the bias layer is heated by the heat generated by a steady-state sensing current when the element is used as a magnetic head. A larger anisotropic coupling magnetic field may be obtained as the magnetic thickness of the ferromagnetic layer is smaller. When the first ferromagnetic layer is made to have a different thickness (a different magnetic thickness) from the thickness of the second ferromagnetic layer, the difference between the magnetic thickness of the first ferromagnetic layer and the magnetic thickness of the second ferromagnetic layer becomes smaller than the magnetic thickness of the ferromagnetic layer of the conventional spin-valve type thin film magnetic element, thereby enabling a larger exchange coupling magnetic field to be obtained in the present invention.

When magnetization of the first ferromagnetic layer is tightly fixed in one direction (for example in the direction substantially perpendicular to the direction of a leakage magnetic field form a magnetic recording medium and a travel direction of the magnetic recording medium) by a large exchange coupling magnetic field (an exchange anisotropic magnetic field) generated at the interface between the first ferromagnetic layer and the bias layer in the present invention, magnetization of the second ferromagnetic layer facing the first ferromagnetic layer separated by the non-magnetic intermediate layer is tightly fixed in an antiparallel direction to the magnetization direction of the first ferromagnetic layer (for example, an opposed direction to the direction substantially perpendicular to the direction of a leakage magnetic field form a magnetic recording medium and a travel direction of the magnetic recording medium). Accordingly, the first and second ferromagnetic layers are put into a ferrimagnetic state in which both magnetization directions are in an antiparallel coupling state. Since the magnetization direction of the second ferromagnetic layer is tightly fixed in the antiparallel direction to the magnetization direction of the first ferromagnetic layer (for example, an opposed direction to the direction substantially perpendicular to the direction of a leakage magnetic field from a magnetic recording medium and a travel direction of the magnetic recording medium), the magnitude of the pinning magnetic field generated by the exchange bias for aligning the magnetization direction of the free magnetic layer in the direction substantially perpendicular to the magnetization direction of the pinned magnetic layer is increased. As a result, the magnetization direction of the free magnetic layer may be certainly aligned and the free magnetic layer is readily put into a single magnetic domain state. Consequently, the magnetic domain of the free magnetic layer is favorably controlled to improve stability of the domain.

The magnitude of the exchange coupling magnetic field generated at the interface between the thinner portion of the bias layer and the first ferromagnetic layer becomes larger than that in the conventional thin film magnetic element, even when the portion in the vicinity of the track portion of the bias layer is thinned by forming the bias layer and the conductive layer by a so-called lift-off method. The magnetization direction at the portion in the vicinity of the track portion of the first ferromagnetic layer is not disturbed, and is aligned in one direction (for example, the direction substantially perpendicular to the leakage magnetic field direction from the magnetic recording medium and the travel direction of the magnetic recording medium). As a result, the magnetization direction at the portion in the vicinity of the track portion of the second ferromagnetic layer is also not disturbed, and the magnetization direction is aligned in the direction antiparallel to the magnetization direction of the first ferromagnetic layer (for example, the direction opposite to the direction substantially perpendicular to the leakage magnetic field direction from the magnetic recording medium and the travel direction of the magnetic recording medium). Accordingly, the magnetization direction is not disturbed at both sides of the track portion of the free magnetic layer, and the magnetization direction of the free magnetic layer is aligned in the same direction as the magnetization direction of the second ferromagnetic layer (for example, the direction opposite to the direction substantially perpendicular to the leakage magnetic field direction from the magnetic recording medium and the travel direction of the magnetic recording medium). Consequently, the output waveform at both ends of the track width is prevented from being abnormal to improve stability of the output waveform.

In the spin-valve type thin film magnetic element according to the present invention, an exchange coupling magnetic field (an exchange coupling magnetic field generated at the interface between the bias layer and the ferromagnetic layer) having the same magnitude as that of the conventional spin-valve type thin film magnetic element may be obtained by forming a thinner bias layer than that in the conventional spin-valve type thin film magnetic element. Therefore, the step height formed in the vicinity of the track portion of the gap layer may be reduced to prevent the shape of the writing magnetic gap of the recording inductive head laminated on the spin-valve type thin film magnetic element from being distorted. Consequently, irregular magnetic recording pattern of the magnetic recording medium caused by the distorted writing magnetic gap of the recording inductive head may be avoided to eliminate causes of regenerative errors.

The thinner bias layer permits the step height formed in the vicinity of the track portion of the gap layer to be small. Therefore, a large distance may be ensured between the bias layer and the conductive layer, and the shield layer formed thereon, also ensuring insulation between the shield layer and the spin-valve type thin film magnetic element.

In the spin-valve type thin film magnetic element according to the present invention, the exchange coupling magnetic field generated at the interface between the bias layer made of an antiferromagnetic material and the ferromagnetic layer is improved, which also increases the pinning magnetic field generated by the exchange bias. Accordingly, stability of the output waveform at both ends along the track width is improved by certainly aligning the magnetization direction of the free magnetic layer in one direction. The bias layer can be thinner than that in the conventional spin-valve type thin film magnetic head while maintaining the magnitude of the exchange coupling magnetic field (Hex) generated between the bias layer and ferromagnetic layer unchanged.

In the spin-valve type thin film magnetic element according to the present invention, the ferromagnetic layers may be disposed on the free magnetic layer with a distance corresponding to a track width, the bias layers may be provided on the ferromagnetic layers, and the conductive layers may be provided on the bias layers.

The bias layers may be provided at both sides in the track width direction of the laminate, the ferromagnetic layers being provided on the bias layers and the conductive layers being provided on the ferromagnetic layers in the spin-valve type thin film magnetic element according to the present invention.

In the spin-valve type thin film magnetic element of the present invention, at least one of the pinned magnetic layer and free magnetic layer may be divided into two sub-layers separated by the non-magnetic intermediate layer, the sub-layers being in a ferrimagnetic state in which the magnetization direction of one sub-layer is 180 degrees different from the magnetization direction of the other sub-layer.

In the spin-valve type thin film magnetic element in which the pinned magnetic layer is divided into two sub-layers separated by the non-magnetic intermediate layer, one of the pinned magnetic layers divided into two sub-layers functions for fixing the other pinned magnetic layer in a proper direction to maintain the pinned magnetic layer in a very stable state.

In the spin-valve type thin film magnetic element in which the free magnetic layer is divided into two sub-layers separated by the non-magnetic intermediate layer, on the other hand, an exchange coupling magnetic field is generated between the free magnetic layers divided into two sub-layers to put the free magnetic layers in a ferrimagnetic state with each other, permitting magnetization of the free magnetic layers to sensitively rotate relative to the external field.

The antiferromagnetic layer preferably comprises at least one element selected from the group consisting of Ni, Fe and Co.

The bias layer preferably comprises an alloy containing at least one element selected from the group consisting of Pt, Pd, Rh, Fe, Ru, Ir, Os, Au, Ag, Cr, Ni, Ne, Ar, Xe and Kr, and Mn.

The bias layer may comprise at least one material selected from the group consisting of NiO, $\alpha$-$Fe_2O_3$ and CoO.

The exchange coupling magnetic field generated at the interface between the bias layer and the ferromagnetic layer in the spin-valve type thin film magnetic element as described above may be improved by constructing the bias layer with the foregoing alloys, without applying any heat-treatment to the bias layer or by heat-treating the bias layer at a temperature lower than the heat-treatment of the antiferromagnetic layer. Accordingly, the pinning magnetic field generated by the exchange bias for certainly aligning the magnetization direction of the free magnetic layer in one direction may be sufficiently increased, while providing a spin-valve type thin film magnetic element having good temperature characteristics of the exchange anisotropic magnetic field and excellent heat resistance. Since the exchange coupling magnetic field generated at the interface between the bias layer and the ferromagnetic layer is larger in the spin-valve type thin film magnetic element according to the present invention than that in the conventional spin-valve type thin film magnetic element, the magnetic element can exhibit good heat resistance with smaller temperature change of the exchange anisotropic magnetic field (exchange coupling magnetic field) even when the magnetic element is attached to a device such as a thin film magnetic head that suffers a high temperature in the device.

The antiferromagnetic layer preferably comprises an alloy containing at least one element selected from the group of Pt, Pd, Rh, Fe, Ru, Ir, Os, Au, Ag, Cr, Ni, Ne, Ar, Xe and Kr, and Mn.

Since the antiferromagnetic layer comprises the foregoing materials, the exchange anisotropic magnetic field has good temperature characteristics and is able to provide a spin-valve type thin film magnetic element with high heat resistance and corrosion resistance.

An excellent spin-valve type thin film magnetic element with a small temperature change of the exchange anisotropic magnetic field (an exchange coupling magnetic field) may be obtained while having good durability when the magnetic element is attached to a device such as a thin film magnetic head that suffers a high temperature in the device.

The blocking temperature may be increased by forming the antiferromagnetic layer with the foregoing alloys. The magnetization direction of the pinned magnetic layer may be tightly fixed by allowing the antiferromagnetic layer to generate a large exchange anisotropic magnetic field.

Preferably, the bias layers comprise an antiferromagnetic material. The antiferromagnetic material may have a lower heat treatment temperature than that of the antiferromagnetic layer. The exchange anisotropic magnetic field of the antiferromagnetic layer is prevented from decreasing at the heat treatment temperature of the bias layer by adjusting the heat treatment temperature of the bias layer to be lower than the heat treatment temperature of the antiferromagnetic layer in manufacturing the spin-valve type thin film magnetic element according to the present invention.

In the spin-valve type thin film magnetic element of the present invention, preferably, the free magnetic layer comprises a first free magnetic layer and a second free magnetic layer which are separated by a non-magnetic intermediate layer, the first free magnetic layer and the second free magnetic layer are in a ferrimagnetic state in which the magnetization direction of the first free magnetic layer is 180 degrees different from the magnetization direction of the second free magnetic layer, at least one of the first free magnetic layer and the second free magnetic layer comprise a CoFeNi alloy, and the non-magnetic intermediate layer comprises Ru.

In such a configuration, the first free magnetic layer is preferably disposed between the non-magnetic conductive layer and the non-magnetic intermediate layer, and the first free magnetic layer comprises the CoFeNi alloy.

In such a configuration, preferably, both the first free magnetic layer and the second free magnetic layer comprise the CoFeNi alloy.

When the free magnetic layer is divided into a first free magnetic layer and a second free magnetic layer which are separated by a non-magnetic intermediate layer of Ru and when the first free magnetic layer and/or the second free magnetic layer is formed of NiFe, the spin flop magnetic field (Hsf) and the saturation magnetic field (Hs), which indicate the degree of the antiparallel coupling state (ferrimagnetic state) generated between the first free magnetic layer and the second free magnetic layer, are decreased. Thus, the magnetization direction in the free magnetic layer may not rotate in a stable ferrimagnetic state with high sensitivity.

When the free magnetic layer is divided into a first free magnetic layer and a second free magnetic layer which are separated by a non-magnetic intermediate layer of Ru and when the first free magnetic layer and/or the second free magnetic layer is formed of only Co or CoFe, the spin flop magnetic field (Hsf) and the saturation magnetic field (Hs) can be increased compared with the above configuration using NiFe. However, the coercive force (Hc) of the free magnetic layer is simultaneously increased, resulting in decreased soft magnetic characteristics. Moreover, it is difficult to suppress the magnetostriction ($\lambda s$) to zero. Thus, this configuration is unsuitable for a thin film magnetic head in which a stress is applied in use.

In the present invention, at least one of the first free magnetic layer and the second free magnetic layer is formed of the CoFeNi alloy. In this configuration, the spin flop magnetic field (Hsf) and the saturation magnetic field (Hs) can be increased compared with the above configuration using NiFe. Thus, the magnetization direction in the free magnetic layer can rotate in a stable ferrimagnetic state with high sensitivity.

Preferably, the CoFeNi alloy comprises 9 to 17 atomic percent Fe, 0.5 to 10 atomic percent Ni, and the balance being Co. The coercive force (Hc) of the free magnetic layer can be decreased to about 10 Oe (800 A/m) and the magnetostriction ($\lambda s$) can be controlled to be within the range between $-3\times10^{-6}$ and $+3\times10^{-6}$. Thus, the free magnetic layer has superior soft magnetic characteristics. When the nonmagnetic conductive layer is composed of Cu, this nonmagnetic conductive layer prevents interdiffusion of Ni and Cu, maintaining a high rate of change in resistance of the spin-valve type thin film magnetic element.

In the above-mentioned spin-valve type thin film magnetic element, preferably, the free magnetic layer comprises a first free magnetic layer and a second free magnetic layer which are separated by a non-magnetic intermediate layer, the first free magnetic layer and the second free magnetic layer are in a ferrimagnetic state in which the magnetization direction of the first free magnetic layer is 180 degrees different from the magnetization direction of the second free magnetic layer, the first free magnetic layer is disposed between the non-magnetic conductive layer and the non-magnetic intermediate layer, the first free magnetic layer comprises a laminate of a CoFe alloy film and a CoFeNi alloy film, and the CoFe alloy film is formed at the non-magnetic conductive layer side.

More preferably, the second free magnetic layer comprises the CoFeNi alloy.

Since at least the first free magnetic layer is composed of the CoFeNi alloy, the free magnetic layer has a larger Hsf value and a larger Hs value compared with a first free magnetic layer composed of a NiFe alloy. Thus, the magnetization of the free magnetic layer can rotate with high sensitivity while maintaining a stable ferrimagnetic state. Moreover, the coercive force of the free magnetic layer can be reduced to improve soft magnetic characteristics, and the magnetostriction $\lambda s$ is readily adjusted to be substantially zero. These characteristics are suitable for thin film magnetic heads.

In particular, the first free magnetic layer is a laminate of the CoFe alloy film and a CoFeNi alloy film, and the CoFe alloy film is formed at the non-conductive layer side. When the non-conductive layer is composed of Cu, the non-conductive layer prevents interdiffusion of Ni and Cu, enhancing the rate of change in resistance of the spin-valve type thin film magnetic element.

Preferably, the CoFeNi alloy comprises 9 to 17 atomic percent Fe, 0.5 to 10 atomic percent Ni, and the balance being Co. The coercive force Hc of the free magnetic layer is controlled to be 800 A/m (10 Oe) or less, and the magnetostriction λs is controlled within the range of $-3\times10^{-6}$ to $+3\times10^{-6}$. Thus, the free magnetic layer has superior soft magnetic characteristics.

In this spin-valve type thin film magnetic element, preferably, the ferromagnetic layer comprises a first ferromagnetic layer and a second ferromagnetic layer which are separated by a non-magnetic intermediate layer, the first ferromagnetic layer and the second ferromagnetic layer are in a ferrimagnetic state in which the magnetization direction of the first ferromagnetic layer is 180 degrees different from the magnetization direction of the second ferromagnetic layer, at least one of the first ferromagnetic layer and the second ferromagnetic layer comprise a CoFeNi alloy, and the non-magnetic intermediate layer comprises Ru.

More preferably, both the first ferromagnetic layer and the second ferromagnetic layer comprise the CoFeNi alloy.

When the ferromagnetic layer is divided into a first ferromagnetic layer and a second ferromagnetic layer which are separated by a non-magnetic intermediate layer of Ru and when the first ferromagnetic layer and/or the second ferromagnetic layer is formed of NiFe, the spin flop magnetic field (Hsf) and the saturation magnetic field (Hs), which indicate the degree of the antiparallel coupling state (ferrimagnetic state) generated between the first ferromagnetic layer and the second ferromagnetic layer, are decreased. Thus, the magnetization direction in the ferromagnetic layer is not fixed in a stable ferrimagnetic state. Since a high exchange coupling magnetic field (Hex) is not generated at the interface between the bias layer and the ferromagnetic layer, the magnetization of the free magnetic layer cannot be aligned in one direction.

In the present invention, at least one of the first ferromagnetic layer and the second ferromagnetic layer is formed of the CoFeNi alloy. In this configuration, the spin flop magnetic field (Hsf) and the saturation magnetic field (Hs) can be increased compared with the above configuration using NiFe. Thus, the magnetization direction in the ferromagnetic layer can be fixed in a stable ferrimagnetic state. When the magnetization of the first ferromagnetic layer is firmly fixed in a certain direction (for example, the direction perpendicular to the leakage magnetic field from a magnetic recording medium or to the moving direction of the magnetic recording medium) by a large exchange coupling magnetic field which is generated at the interface between the first ferromagnetic layer and the bias layer, the magnetization of the second ferromagnetic layer opposing the first ferromagnetic layer with the non-conductive intermediate layer therebetween is firmly fixed in the direction which is antiparallel to the magnetization of the first ferromagnetic layer (for example, the direction which is opposite to the direction perpendicular to the leakage magnetic field from a magnetic recording medium or to the moving direction of the magnetic recording medium). Thus, the magnetization of the first ferromagnetic layer and the magnetization of the second ferromagnetic layer are in a strong antiparallel coupling state, that is, a strong ferrimagnetic state.

Since the magnetization of the second ferromagnetic layer is firmly fixed in the direction which is antiparallel to the magnetization of the first ferromagnetic layer, the magnetization of the free magnetic layer is aligned by a large pinning magnetic field of the exchange bias in a direction which is perpendicular to the magnetization direction of the pinned magnetic layer. Since the free magnetic layer is aligned into a single-domain state, side reading is suppressed, preventing an abnormal output waveform at both ends of the track width.

The thin film magnetic head according to the present invention comprises any one of the spin-valve type thin film magnetic elements according to the present invention provided on a slider.

The thin film magnetic head as described above also has good heat resistance and a sufficient exchange coupling magnetic field at the interface between the bias layer comprising the antiferromagnetic material and ferromagnetic layer. The large pinning magnetic field of the exchange bias allows the magnetization direction of the free magnetic layer to be certainly aligned in one direction to prevent Barkhausen noises from generating. Distortion of the magnetization direction at both side portions of the track portion of the free magnetic layer as well as abnormal output waveform at both sides along the track width may be prevented, thereby stabilizing the output waveform to make the thin film magnetic head to be highly reliable.

Since generation of large step heights in the shield layer is prevented, magnetic recording errors may be prevented by reducing the gap distortion of the inductive head formed on the shield layer. Insulation properties between the inductive head and the shield layer may be readily ensured to obtain a thin film magnetic head with high reliability.

DESCRIPTION OF THE PREFERRED EMBODIMENT

Embodiments of the spin-valve type thin film magnetic element according to the present invention will be described in detail with reference to the drawings.

[First Embodiment]

Figure 1:
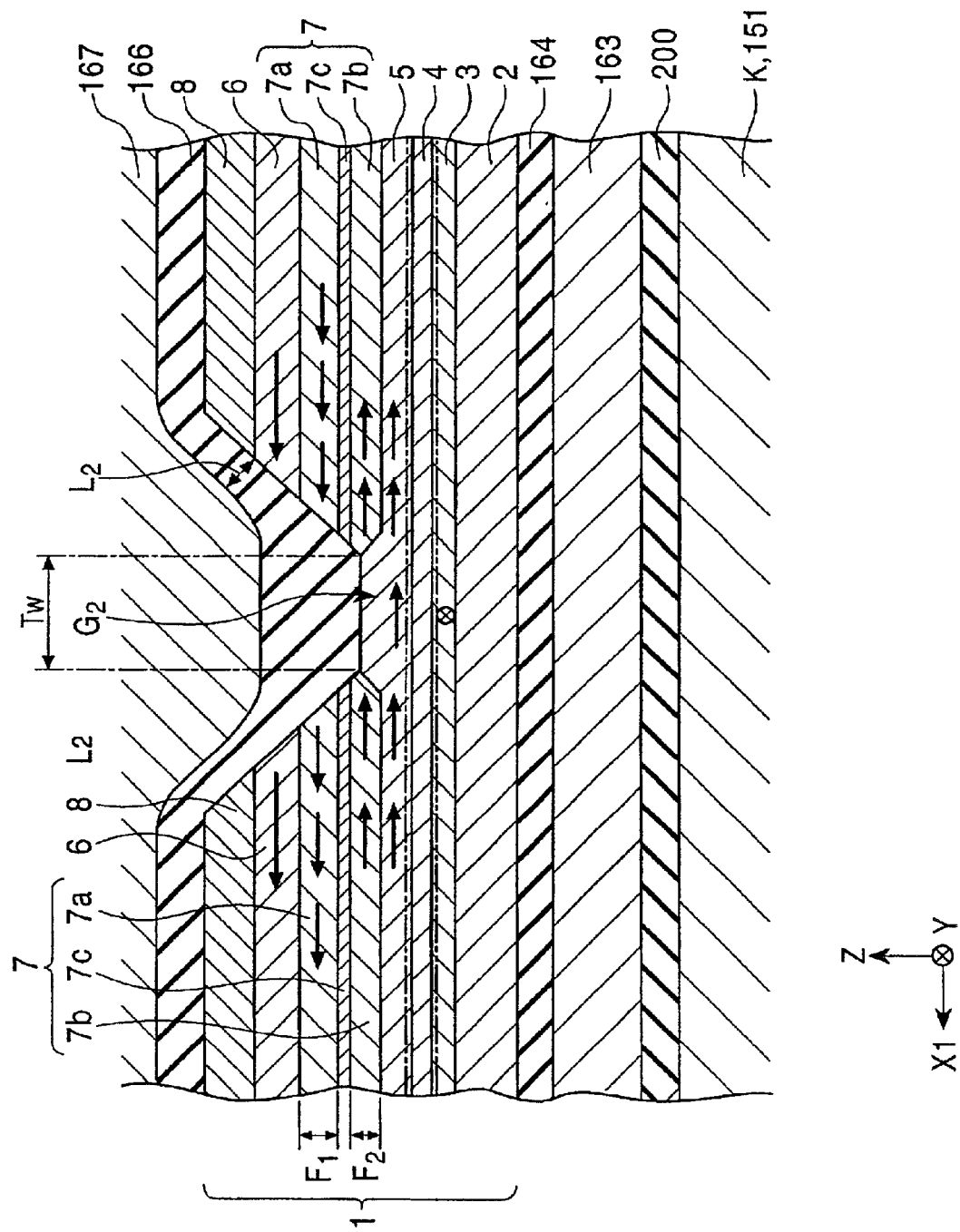
FIG. 1 shows a cross section of the structure of the spin-valve type thin film magnetic element in the first embodiment of the present invention viewed from the opposed face side to the recording medium.
Figure 2:
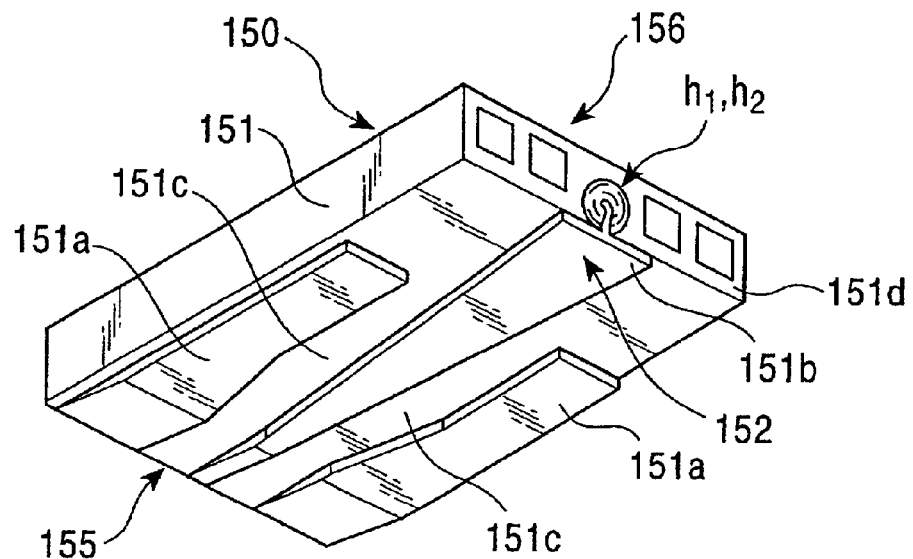
FIG. 2 shows a perspective view of the thin film magnetic head comprising the spin-valve type thin film magnetic element in the first embodiment of the present invention.
Figure 3:
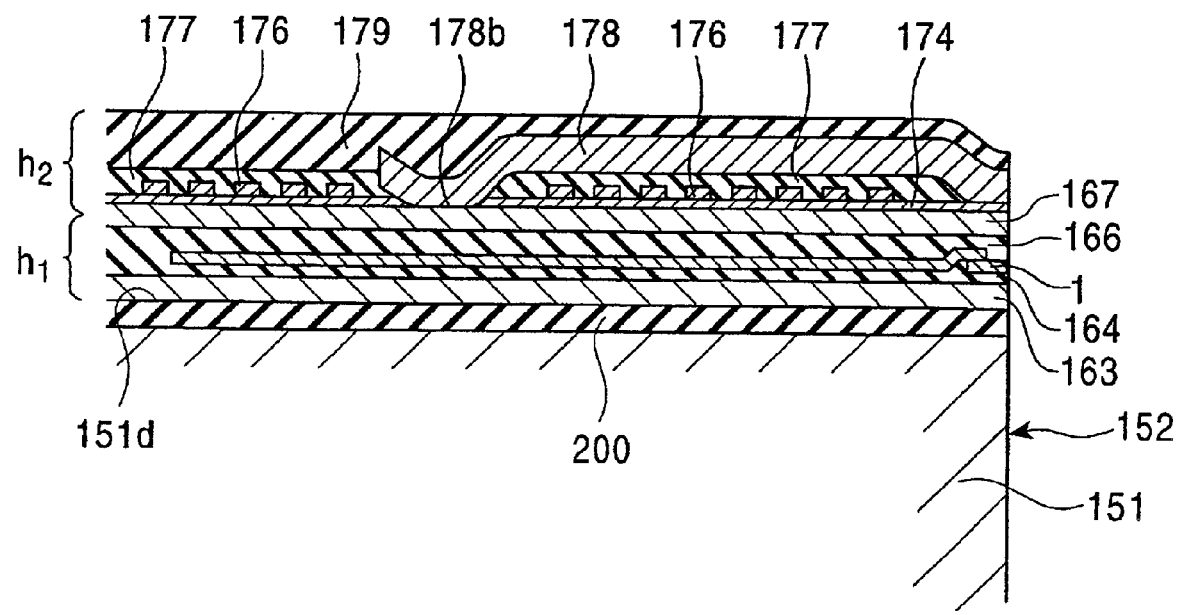
FIG. 3 shows a cross section of the main part of the thin film magnetic head comprising the spin-valve type thin film magnetic element in the first embodiment of the present invention.

FIG. 1 shows a cross section of the structure of the spin-valve type thin film magnetic element in the first embodiment of the present invention viewed from the opposed face side to the recording medium. FIGS. 2 and 3 show a thin film magnetic head comprising the spin-valve type thin film magnetic element according to the present invention.

Shield layers are formed on and under the spin-valve type thin film magnetic element 1 according to the present invention separated by gap layers. A regenerative GMR head $h_1$ is composed of the spin-valve type thin film magnetic element, the gap layers and the shield layers.

A recording inductive head $h_2$ may be laminated on the regenerative GMR head $h_1$.

The GMR head $h_1$ comprising the spin-valve type thin film magnetic element 1 is provided at the trailing side 151d of a slider 151 together with the inductive head $h_2$, and constitutes a thin film magnetic head 150 to enable sensing of a recorded magnetic field from a magnetic recording medium such as a hard disk.

In FIG. 1, the magnetic recording medium travels in the Z direction in the drawing, and the direction of a leakage magnetic field from the magnetic recording medium is along the Y direction.

The thin film magnetic head 150 shown in FIG. 2 is mainly composed of a slider 151, and the GMR head $h_1$ and inductive head $h_2$ provided at the end face 151d of the slider 151. The reference numeral 155 denotes a leading side located at the upstream side of the travel direction of the magnetic recording medium of the slider 151, and the reference numeral 156 denotes the trailing side. Rails 151a, 151a and 151b are formed on the opposed face to the medium of the slider 151, and air groups 151c and 151c are formed between the rails.

As shown in FIG. 3, the GMR head $h_1$ comprises a substrate layer 200 of a non-magnetic insulation member made of $Al_2O_3$ formed on the end face 151d of the slider 151, a lower shield layer 163 made of a magnetic alloy formed on the substrate layer 200, a lower gap layer (lower insulation layer) 164 laminated on the lower shield layer 163, a spin-valve type thin film magnetic element 1 exposed from the opposed face 152 to the medium, an upper gap layer 166 covering the spin-valve type thin film magnetic element 1 and the lower gap layer 164, and an upper shield layer 167 covering the upper gap layer (upper insulation layer) 166.

The upper shield layer 167 also serves as a lower core layer of the inductive head $h_2$.

The inductive head $h_2$ comprises a lower core layer (upper shield layer) 167, a gap layer 174 laminated on the lower core layer 167, a coil 176, an upper insulation layer 177 covering the coil 176, and an upper core layer 178 bonded to the gap layer 174 and bonded to the lower core layer 167 at the coil 176 side.

The coil 176 is patterned to be a planar spiral. The base 178b of the upper core layer 178 is magnetically coupled to the lower core layer 167 at near the center of the coil 176.

A protective layer 179 made of alumina is laminated on the upper core layer 178.

The spin-valve type thin film magnetic element 1 in the first embodiment shown in FIG. 1 is a so-called bottom type single spin-valve type thin film magnetic element in which one layer each of an antiferromagnetic layer, a pinned magnetic layer, a non-magnetic conductive layer and a free magnetic layer are laminated.

The magnetization direction of the free magnetic layer is aligned in a direction substantially perpendicular to the magnetization direction of the pinned magnetic layer by an exchange bias method using an antiferromagnetic material as a bias layer in the spin-valve type thin film magnetic element 1 in this example.

The exchange bias method is suitable for a spin-valve type thin film magnetic element having a narrow track width corresponding to a high density recording, as compared with a hard bias method in which effective track width is hardly controllable due to the presence of a dead zone.

The letter K in FIG. 1 denotes a substrate (corresponds to the slider 151 made of an $Al_2O_3$—TiC based ceramic in FIG. 3). An antiferromagnetic layer 2 is formed on this substrate K separated by a substrate layer 200 made of a non-magnetic insulator $Al_2O_3$ (alumina), a lower shield layer 163 and a lower gap layer 164. A pinned magnetic layer 3 is formed on the antiferromagnetic layer 2, a non-magnetic conductive layer 4 is formed on the pinned magnetic layer 3, and a free magnetic layer 5 is formed on the non-magnetic conductive layer 4. The laminate comprises the antiferromagnetic layer 2, pinned magnetic layer 3, non-magnetic conductive layer 4 and free magnetic layer 5 laminated in this order.

Ferromagnetic layers 7, 7 are formed on the free magnetic layer 5 with a distance corresponding to the track width Tw apart. Bias layers 6, 6 are provided on the ferromagnetic layers 7, 7, and conductive layers 8, 8 are formed on the bias layers 6, 6.

The antiferromagnetic layer 2 comprises an alloy containing at least one element of Pt, Pd, Ir, Rh, Ru, Os, Au, Ag, Cr, Ni, Ne, Ar, Xe and Kr, and Mn. The antiferromagnetic layer 2 comprising such alloy has good heat resistance and corrosion resistance.

Preferably, the antiferromagnetic layer 2 is made of an alloy represented by the following composition formula:

$$X_m Mn_{100-m}$$

wherein X represents at least one of Pt, Pd, Ir, Rh, Ru and Os, and m representing the composition ratio is in the range of 48 at $\% \leq m \leq 60$ at $\%$ (at $\%$ refers to the atomic percentage hereinafter).

The antiferromagnetic layer 2 may be made of an alloy represented by the following composition formula:

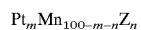

$$Pt_m Mn_{100-m-n} Z_n$$

wherein Z is at least one of Pd, Ir, Rh, Ru and Os, and m and n representing the composition ratios are in the ranges of 48 at $\% \leq m+n \leq 60$ at $\%$ and 0.2 at $\% \leq n \leq 40$ at $\%$.

It is desirable that the antiferromagnetic layer is made of an alloy having the following composition formula in the spin-valve type thin film magnetic element:

$$Pt_qMn_{100-q-j}L_j$$

wherein L is at least one element selected from the group consisting of Au, Ag, Cr, Ni, Ne, Ar, Xe and Kr, and q and j representing the composition ratios are in the ranges of 48 at %≦q+j≦60 at % and 0.2 at %≦j≦10 at %.

More preferably, q and j representing the composition ratios are in the ranges of 48 at %≦q+j≦58 at % and 0.2 at %≦j≦10 at %.

The pinned magnetic layer 3 is made of, for example, a Co film, a NiFe alloy, a CoNiFe alloy, a CoFe alloy and a CoNi alloy.

The pinned magnetic layer 3 shown in FIG. 1 is formed in contact with the antiferromagnetic layer 2, and is magnetized by an exchange anisotropic magnetic field by an exchange coupling generated at the interface between the pinned magnetic layer 2 and antiferromagnetic layer 2 when the pinned magnetic layer is heat-treated in a magnetic field.

The magnetization direction of the pinned magnetic layer 3 is fixed in the Y direction, or a direction away from the recording medium (height direction).

The non-magnetic conductive layer 4 preferably made of a non-magnetic conductive film of such as Cu, Au and Ag.

The free magnetic layer 5 is preferably made of the same material as the pinned magnetic layer 3.

Each of the ferromagnetic layers 7 is divided into two sub-layers, namely, a first ferromagnetic layer 7a and a second ferromagnetic layer 7b separated by a non-magnetic intermediate layer 7c. The first ferromagnetic layer 7a contacts the bias layer 6, and the second ferromagnetic layer 7b facing the first ferromagnetic layer 7a separated by the non-magnetic intermediate layer 7c contacts the free magnetic layer 5.

The first and second ferromagnetic layers 7a, 7b are made of a metal containing at least one element selected from the group consisting Ni, Fe and Co. Example of the metals include Co, Ni, Fe, a Co—Fe alloy, a Co—Ni—Fe alloy, a CoNi alloy and a NiFe alloy. The ferromagnetic layers are preferably made of the same metals and alloys as those constituting the free magnetic layer 5. The ferromagnetic layers 7 are preferably made of the NiFe alloy when the surface of the free magnetic layer 5 is made of the NiFe alloy. This is because a ferromagnetic coupling can be certainly obtained at the interface between the ferromagnetic layers 7 and the free magnetic layer 5 when the ferromagnetic layers 7 are made of the same material as that constituting the free magnetic layer 5. The exchange coupling magnetic field generated at the interface between the bias layers 6 and ferromagnetic layers 7 may be transferred to the free magnetic layer 5 separated by the ferromagnetic layers 7.

Since the magnetic film thickness (a product of saturation magnetization and film thickness) of the first ferromagnetic layers 7a should be different from the magnetic film thickness of the second ferromagnetic layers 7b, the first ferromagnetic layers 7a have a different film thickness from the film thickness of the second ferromagnetic layers 7b when the two sub-layers are made of the same material. In the first embodiment, the first ferromagnetic layers 7a are designed to have a slightly larger film thickness (magnetic film thickness) than the film thickness (magnetic film thickness) of the second ferromagnetic layers 7b.

The non-magnetic intermediate layers 7c preferably contain at least one element selected from the group consisting of Ru, Rh, Ir, Cr, Re and Cu.

The bias layers 6 comprise an alloy containing at least one element selected from the group consisting of Pt, Pd, Rh, Ru, Fe, Ir, Os, Au, Ag, Cr, Ni, Ne, Ar, Xe and Kr, and Mn. This bias layer may be composed of a material selected from NiO, α-Fe$_2$O$_3$ and CoO.

The bias layer 6 comprising any one of the alloys described above may have a large exchange anisotropic magnetic field generated at the interface between the bias layer and the first ferromagnetic layers 7a of the ferromagnetic layers 7, by applying a heat-treatment in the magnetic field at a temperature lower than the heat treatment temperature of the antiferromagnetic layer 2, or without applying a heat-treatment. Consequently, the magnitude of the pinning magnetic field of the exchange bias becomes large enough for certainly aligning the magnetization direction of the free magnetic layer 5 in one direction. The exchange anisotropic magnetic field has good temperature characteristics as well as high heat resistance. The exchange coupling magnetic field generated at the interface between the two ferromagnetic layers 7 is larger than that in the conventional magnetic element, even when the ferromagnetic layers are heated by the steady-state sensing current. Therefore, the magnetic element has high heat resistance besides having a small temperature change of the exchange anisotropic magnetic field (exchange coupling magnetic field).

The bias layer 6 is preferably an alloy comprising the following composition formula:

$$X_mMn_{100-m}$$

wherein X represents at least one element selected from the group consisting of Pt, Pd, Rh, Ru, Fe, Ir, Os, Au, Ag, Cr, Ni, Ne, Ar, Xe, and Kr, and m representing the composition ratio is in the range of 0 at %<m≦21 at % or 36 at %≦m≦60 at %.

More preferably, the bias layer is an alloy represented by the following composition formula:

$$X_mMn_{100-m}$$

wherein X represents at least one element selected from the group consisting of Pt, Pd, Ir, Rh, Ru, Os, and m representing the composition ratio is in the range of 52 at % ≦m≦60 at %.

The bias layer 6 may be an alloy represented by the following composition formula:

$$Pt_mMn_{100-m-n}Z_n$$

wherein Z represents at least one element selected from the group consisting of Pd, Ir, Rh, Ru and Os, and m and n representing the composition ratios are within the ranges of 52 at %≦m+n≦60 at % and 0.2 at %≦n≦40 at %.

The bias layer in the spin-valve type thin film magnetic element may be an alloy represented by the following composition formula:

$$Pt_qMn_{100-q-j}L_j$$

wherein L represents at least one element selected from the group consisting of Au, Ag, Cr, Ni, Ne, Ar, Xe and Kr, and q and j representing the composition ratios are within the ranges of 52 at %≦q+j≦60 at %, and 0.2 at %≦j≦10 at %.

Decrease of the exchange anisotropic magnetic field of the antiferromagnetic layer 2 by the temperature during the heat treatment of the bias layer 6 can be prevented by using an antiferromagnetic material having a lower heat treatment temperature than the antiferromagnetic layer 2, or an antiferromagnetic material before the heat treatment as the alloy constituting the bias layer 6.

The conductive layers 8, 8 are preferably formed of, for example, Au, W, Cr and Ta.

The magnetic film thickness of the first ferromagnetic layers 7a are slightly larger than the magnetic film thickness of the second ferromagnetic layers 7b in the spin-valve type thin film magnetic element 1, and the difference of the magnetic film thickness of the first and second ferromagnetic layers is also small. Accordingly, a large exchange coupling magnetic field (exchange anisotropic magnetic field) is generated at the interface between the first ferromagnetic layers 7a of the ferromagnetic layers 7 and bias layers 6. Magnetization of the first ferromagnetic layers 7a is tightly fixed along the X1 direction as shown in FIG. 1 by the large exchange coupling magnetic field (exchange anisotropic magnetic field) generated at the interface between the first ferromagnetic layers 7a and bias layers 6. Tightly fixing magnetization of the first ferromagnetic layers 7a in the X1 direction allows magnetization of the second ferromagnetic layers 7b to be tightly fixed in an antiparallel direction to the magnetization direction of the first ferromagnetic layers 7a, or in the opposed direction to the X1 direction in FIG. 1. Therefore, the first and second ferromagnetic layers 7a and 7b are in a ferrimagnetic state with their magnetizations being coupled antiparallel to each other. Since magnetization of the second ferromagnetic layers is tightly fixed in the direction opposed to the X1 direction, the pining magnetic field of the exchange bias for aligning magnetization of the free magnetic layer 5 in the direction substantially perpendicular to the magnetization direction of the pinned magnetic layer is increased. Consequently, the magnetization direction of the free magnetic layer 5 is certainly aligned in the opposed direction to the X1 direction to put the free magnetic layer 5 into a single magnetic domain state.

The magnetization direction of the free magnetic layer 5 shifts from the direction opposed to the X direction to the Y direction in the spin-valve type thin film magnetic element 1, when a steady-state current flows from the conductive layers 8, 8 through the free magnetic layer 5, non-magnetic conductive layer 4 and the pinned magnetic layer 3, and a leakage magnetic field from a magnetic recording medium running in the Z direction is applied along the Y direction. The electrical resistance varies by the relationship between the shift of the magnetization direction in the free magnetic layer 5 and the magnetization direction of the pinned magnetic layer 3, and the leakage magnetic field from the magnetic recording medium is sensed by the voltage change based on the resistance change.

In the spin-valve type thin film magnetic element 1 having the construction as hitherto described, the exchange coupling magnetic field generated at the interface between the thin portion of the bias layers 6 and the first ferromagnetic layers 7a becomes large even when the film thickness at the portion in the vicinity of the track portion of the bias layers 6 is reduced by forming the bias layers 6 and conductive layers 8 by the so-called lift-off method. Therefore, the magnetization direction at the portion in the vicinity of the track portion of the first ferromagnetic layers 7a is not disturbed, and the direction is aligned in the X1 direction as shown in FIG. 1. Consequently, the magnetization direction of the second ferromagnetic layers 7b is also not disturbed at the portion in the vicinity of the track portion, and is aligned in the antiparallel direction (the direction opposed to the X1 direction) to the magnetization direction of the first ferromagnetic layers 7a. Accordingly, the magnetization direction of the free magnetic layer 5 is also not disturbed at both sides of the track portion. The magnetization direction of the free magnetic layer 5 may be aligned in the same direction as the magnetization direction of the second ferromagnetic layer 7b, or in the opposed direction to the X1 direction. Consequently, the output waveform at both ends of the track width Tw is protected from being abnormal to stabilize the output waveform.

The bias layers of the spin-valve type thin film magnetic element 1 may be thinner than the bias layers of the conventional spin-valve type thin film magnetic element for obtaining the same magnitude of the exchange coupling magnetic field (the exchange coupling magnetic field generated at the interface between the bias layer and the ferromagnetic layer) as that of the conventional spin-valve type thin film magnetic element. For example, the bias layers may have a thickness of as thin as about 13 nm in the thin film magnetic element 1 as compared with the thickness of the bias layers of 30 nm in the conventional thin film magnetic element. Accordingly, the step height of the upper gap layer 166 formed in the vicinity of the track portion may be reduced to prevent the shape of the magnetic gap of the inductive head $h_2$ laminated on the spin-valve type thin film magnetic element 1 from being distorted. Therefore, distorted magnetic recording patterns of the magnetic recording medium caused by the distorted shape of the writing magnetic head of the recording inductive head $h_2$ may be avoided, thereby eliminating the cause of regenerative errors.

Since the bias layers 6 are thinned to reduce the step height formed in the vicinity of the track portion of the gap layer, the distance between each bias layers or conductive layers and the shield layer formed on these layers increases. For example, the distance $L_2$ between each bias layers and conductive layers, and the upper shield layer 167 formed on the conductive layer 8 separated by the upper gap layer 166, is as large as 25 to 35 nm in the thin film magnetic element 1 according to this embodiment, as compared with the corresponding distance $L_1$ of 10 to 20 nm between each bias layers and conductive layers, and the upper shield layer formed on the conductive layers separated by the upper gap layer in the conventional thin film magnetic element. Therefore, insulation between the shield layer 167 and the spin-valve type thin film magnetic element 1 is readily ensured.

Accordingly, the magnitude of the exchange coupling magnetic field generated at the interface between the bias layers 6 made of an antiferromagnetic material and the ferromagnetic layers 7 increases in the spin-valve type thin film magnetic element 1 according to the first embodiment, thereby pinning magnetic field of the exchange bias is increased. Consequently, stability of the output waveform at both ends of the track width Tw is improved by certainly aligning the magnetization direction of the free magnetic layer 5 in one direction. The thickness of the bias layers of the spin-valve type thin film magnetic element may be reduced in the first embodiment as compared with the thickness of the bias layers of the conventional spin-valve type thin film magnetic element, for obtaining the same magnitude of the exchange coupling magnetic field (Hex) generated at the interface between the bias layer 6 and ferromagnetic layer 7 in both cases.

The manufacturing method that can be favorably used for manufacturing the spin-valve type thin film magnetic element 1 according to the first embodiment will be described hereinafter.

This manufacturing method utilizes a feature that the magnitude of the exchange anisotropic magnetic field generated by heat treatment at the antiferromagnetic layer 2 and the bias layers 6, 6 differs depending on the locations of the antiferromagnetic layer 2 and the bias layers 6, 6 in the spin-valve type thin film magnetic element 1. The magnetization direction of the pinned magnetic layer 3 is fixed by the first heat treatment, and the magnetization direction of the free magnetic layer 5 is aligned in the direction substantially perpendicular to the magnetization direction of the pinned magnetic layer 3 by the second heat treatment.

In the method for manufacturing the spin-valve type thin film magnetic element 1, the antiferromagnetic layer 2, the pinned magnetic layer 3, the non-magnetic conductive layer 4 and the free magnetic layer 5 are sequentially laminated on the lower gap layer (lower insulation layer) 164 formed on the substrate K separated by the substrate layer 200 and the lower shield layer 163 to form the first laminate. Subsequently, the laminate is heat-treated at a first heat treatment temperature while applying a first magnetic field to the first laminate along the direction perpendicular to the track width Tw direction. An exchange anisotropic magnetic field is generated in the antiferromagnetic layer 2 to fix magnetization of the pinned magnetic layer 3.

Then, a lift-off resist having a base width corresponding to the track width Tw is formed on the first laminate, and the surface of the free magnetic layer 5 not covered with the lift-off resist as a mask is cleaned by an ion-milling method or inverse sputtering method using a rare gas such as Ar.

Then, the ferromagnetic layers 7, 7 comprising the second ferromagnetic layers 7a, non-magnetic intermediate layers 7c and the first ferromagnetic layers 7b are formed on the exposed free magnetic layer 5 with a distance apart corresponding to the track width Tw, and on the lift-off resist. Subsequently, after forming the bias layers 6, 6 on the ferromagnetic layers 7, 7, and the conductive layers 8, 8 on the bias layers 6, 6, the lift-off resist is removed by an organic solvent, thereby obtaining the second laminate having the same shape as the spin-valve type thin film magnetic element 1 shown in FIG. 1.

The second laminate obtained as described above is heat-treated at a second heat treatment temperature while applying a second magnetic field having a magnitude smaller than the magnitude of the exchange anisotropic magnetic field of the antiferromagnetic layer 2 in the track width Tw direction. The spin-valve type thin film magnetic element 1 is obtained by applying a bias magnetic field to the free magnetic layer 5 in the direction substantially perpendicular to the magnetization direction of the pinned magnetic layer 3.

The relationship between the heat treatment temperature of the antiferromagnetic layer and the exchange anisotropic magnetic field will be described below.

The spin-valve type thin film magnetic element 1 according to the first embodiment is a bottom type spin-valve type thin film magnetic element 1 having a close distance between the antiferromagnetic layer 2 and the substrate K (or the antiferromagnetic layer 2 is disposed between the substrate K and the free magnetic layer 5). The bias layer 6 made of a material similar to the alloy used for the antiferromagnetic layer 2 is disposed at the location remote from the substrate K than the antiferromagnetic layer 2. A top type single spin-valve type thin film magnetic element is a counterpart of the bottom type spin-valve type thin film magnetic element. The distance between the antiferromagnetic layer and the substrate is longer in the top type single spin-valve type thin film magnetic element (or the antiferromagnetic layer is disposed at a location remote from the substrate than the free magnetic layer) as compared with the bottom type single spin-valve type thin film magnetic element.

An exchange anisotropic magnetic field is generated in the antiferromagnetic layer 2 and the magnetization direction of the pinned magnetic layer 3 is fixed by heat-treating the first laminate at the first heat treatment temperature [for example at 220 to 270° C. (493 to 543 K)], while applying the first magnetic field in manufacturing the bottom type spin-valve type thin film magnetic element 1. The exchange anisotropic magnetic field of the antiferromagnetic layer 2 is 48 kA/m (600 Oe) or more.

The magnetization direction of the free magnetic layer 5 is aligned in the direction substantially perpendicular to the first magnetic field, by heat-treating the second laminate at the second heat treatment temperature [for example at 200 to 240° C. (473 to 513 K)] lower than the first heat treatment temperature while applying the second magnetic field in the direction substantially perpendicular to the first magnetic field. The magnitude of the exchange anisotropic magnetic field of the bias layer 6 is 24 kA/m (300 Oe) or more.

Since the second heat treatment temperature is lower than the first heat treatment temperature, the exchange anisotropic magnetic field of the antiferromagnetic layer 2 is not degraded by the second heat treatment, thereby preventing the exchange anisotropic magnetic field generated between the antiferromagnetic layer 2 and the pinned magnetic layer 3 from decreasing.

When the magnitude of the second magnetic field is smaller than the magnitude of the exchange anisotropic magnetic field of the antiferromagnetic layer 2 generated by the foregoing heat treatment, the exchange anisotropic magnetic field of the antiferromagnetic layer 2 is not degraded by applying the second magnetic field to the antiferromagnetic layer 2, enabling the magnetization direction of the pinned magnetic layer 3 to remain fixed.

Consequently, the magnetization direction of the pinned magnetic layer 3 may be aligned in the direction substantially perpendicular to the magnetization direction of the free magnetic layer 5.

The preferable first heat treatment temperature is in the range of 220 to 270° C. (493 to 543 K). The first heat treatment temperature of less than 220° C. (493 K) is not preferable, since the magnitude of the exchange anisotropic magnetic field of the antiferromagnetic layer 2 becomes less than 16 kA/m (200 Oe) to fail in tightly fixing the magnetization direction of the pinned magnetic layer 3, and the pinned magnetic layer 3 is magnetized in the same direction as the magnetization direction of the free magnetic layer 5 by the second heat treatment. The first heat treatment temperature of more than 270° C. (534 K) is also not preferable since deterioration of the magnetoresistive effect is induced by thermal diffusion of atoms at the interface between the Cu layer as the non-magnetic conductive layer 4 and the free magnetic layer 5, or at the interface between the Cu layer and pinned magnetic layer 3.

The first heat treatment temperature in the range of 230° C. (503 K) to 270° C. (543 K) is more preferable, since the magnitude of the exchange anisotropic magnetic field of the antiferromagnetic field 2 is made to be larger than 32 kA/m (400 Oe) to increase magnetization of the pinned magnetic layer 3.

The second heat treatment temperature is preferably in the range of 200 to 240° C. (473 to 513 K). The second heat treatment temperature of less than 200° C. (473 K) is not preferable since the magnitude of the exchange anisotropic magnetic field of the bias layer 6 cannot be increased to 8 kA/m (100 Oe) or more and the vertical bias magnetic field applied on the free magnetic layer 5 cannot be increased. The second heat treatment temperature of more than 270° C.

(543 K) is also not preferable since the magnitude of the exchange anisotropic magnetic field of the bias layer 6 has been already saturated and odes not increase, thereby inducing deterioration of the magnetoresistive effect due to thermal diffusion of atoms at the interface.

The magnitude of the first magnetic field is preferably about 800 A/m (10 Oe). The magnitude of the first magnetic field of less than 800 A/m (10 Oe) is not preferable since a sufficient magnitude of the exchange anisotropic magnetic field of the antiferromagnetic layer 2 cannot be obtained.

The magnitude of the second magnetic field is adjusted to be smaller than the magnitude of the exchange coupling magnetic field of the antiferromagnetic layer 2 generated by the first heat treatment, and the range is preferably 800 to 48000 A/m (10 to 600 Oe), more preferably about 16 kA/m (200 Oe). The magnitude of the second magnetic field of less than 800 A/m (10 Oe) is not preferable since a sufficient magnitude of the exchange anisotropic magnetic field of the bias layer 6 cannot be obtained. The magnitude of the second magnetic field of more than 48 kA/m (600 Oe) is also not preferable since the exchange coupling magnetic field of the antiferromagnetic layer generated by the first heat treatment may be degraded.

The nature of the antiferromagnetic layer is utilized in the method for manufacturing the spin-valve type thin film magnetic element.

An alloy having the composition of $X_m Mn_{100-m}$ is used for the antiferromagnetic layer 2 in the spin-valve type thin film magnetic element 1 according to the present invention as a bottom type spin-valve type thin film magnetic element (wherein X represents at least one element selected from the group consisting of Pt, Pd, Ir, Rh, Ru and Os). The composition ratio m is preferably in the range of 48 at %≦m≦60 at %.

When the composition ratio m is less than 48 at % or more than 60 at %, the crystal lattice of $X_m Mn_{100-m}$ may be hardly rearranged into a $L1_o$ type ordered lattice by applying the first heat treatment at a heat treatment temperature of 245° C. (518 K) and does not exhibit antiferromagnetic properties. The composition ratio is not preferable since unidirectional exchange coupling magnetic field (exchange anisotropic magnetic field) cannot be exhibited.

A more preferable composition ratio m is in the range of 48 at %≦m≦58 at %.

When the composition ratio m is less than 48 at % or more than 58 at %, the crystal lattice of $X_m Mn_{100-m}$ is hardly rearranged into a $L1_o$ type ordered lattice by applying the first heat treatment at the heat treatment temperature of 245° C. (518 K) and does not exhibit antiferromagnetic properties. The composition ratio is not preferable since unidirectional exchange coupling magnetic field cannot be exhibited.

The more preferable range of the composition ratio m is 49.8 at %≦m≦58 at %. A magnitude of the exchange anisotropic magnetic field of more than 32 kA/m (400 Oe) may be attained after the first heat treatment at the heat treatment temperature of 245° C. (518 K).

When the antiferromagnetic layer 2 is represented by $Pt_m Mn_{100-m-n}$ (wherein Z represents one or plural elements of Pd, Ir, Rh, Ru, Ir and Os), the composition ratios m and n are preferably in the ranges of 48 at %≦m+n≦60 at %, and 0.2 at %≦n≦40 at %.

When the composition ratios of m and n are less than 48 at % and exceeds 60 at %, the crystal lattice of $Pt_m Mn_{100-m-n}$ is hardly rearranges into a $L1_o$ type ordered lattice and does not exhibit antiferromagnetic properties, even by applying the first heat treatment at the heat treatment temperature of 245° C. (518 K). The composition ratio is not preferable since unidirectional exchange coupling magnetic field cannot be exhibited.

The atomic percentages (n) of less than 0.2% and more than 40% are not preferable, since an acceleration effect for ordering the crystal lattice of the antiferromagnetic layer 2, or an effect for enhancing the exchange anisotropic magnetic field becomes poor in the former case, and the exchange anisotropic magnetic field decreases in the latter case.

The preferable range of m+n is 48 at %≦m+n≦58 at %.

The crystal lattice of $Pt_m Mn_{100-m-n} Z_n$ may be hardly rearranged into a $L1_o$ type ordered lattice by the first heat treatment at the heat treatment temperature of 245° C. (518 K) and does not exhibit antiferromagnetic properties, when m+n is less than 48 at % or more than 58 at %. The composition ratios are not preferable since the crystal lattice does not exhibit unidirectional exchange coupling magnetic field.

The more preferable ranges of m and n are 49.8 at %≦m+n≦58 at % and 0.2 at %≦n≦40 at %, where a magnitude of the exchange anisotropic magnetic field of more than 32 kA/m (400 Oe) can be attained.

When the antiferromagnetic layer 2 is represented by $Pt_q Mn_{100-q-j} L_j$ (wherein L represents at least one element selected from the group consisting of Au, Ag, Cr, Ni, Ne, Ar, Xe and Kr), q and j representing the composition ratios are preferably in the range of 48 at %≦q+j≦60 at % and 0.2 at %≦j≦10 at %.

When q+j is less than 48 at % or more than 60 at %, the crystal lattice of $Pt_q Mn_{100-q-j} L_j$ is hardly rearranged into a $L1_o$ type ordered lattice and does not exhibit antiferromagnetic properties. The composition ratio is not preferable since the antiferromagnetic layer does not exhibit unidirectional exchange coupling magnetic field.

The composition ratio j of less than 0.2 at % is not preferable since the unidirectional exchange coupling magnetic field is not sufficiently improved by addition of the element L. The composition ratio j of more than 10 at % is also not preferable since the unidirectional exchange anisotropic magnetic field decreases.

The more preferable range of the composition ratio q+j is 48 at %≦q+j≦58 at %.

When q+j is less than 48 at % or more than 58 at %, the crystal lattice of $Pt_q Mn_{100-q-j} L_j$ is hardly rearranged into the $L1_o$ type ordered lattice and does not exhibit antiferromagnetic properties, even by applying the first heat treatment at the heat treatment temperature of 245° C. (518 K). The composition rages are not preferable since the crystal does not show the unidirectional exchange coupling magnetic field.

The more preferable ranges of q and j are 49.8 at %≦q+j≦58 at % and 0.2 at %≦j≦10 at %, where an exchange anisotropic magnetic field of more than 32 kA/m (400 Oe) is obtained.

The composition ratio m in the composition formula is preferably in the range of 52 at %≦m≦60 at %, when the bias layer 6 is formed of an alloy with a composition formula of $X_m Mn_{100-m}$ (wherein X represents at least one element selected from the group consisting of Pt, Pd, Ir, Rh, Ru and Os). When m is less than 52 at % or more than 60 at %, the crystal lattice of $X_m Mn_{100-m}$ is hardly rearranged into a L1o type ordered lattice and does not exhibit antiferromagnetic properties, even by applying the second heat treatment at the heat treatment temperature of 240° C. (513 K). The composition ratio is not preferable since a unidirectional exchange coupling magnetic field is not exhibited.

The more preferable composition ratio m is in the range of 52.8 at %≦m≦59.2 at %, where an exchange anisotropic magnetic field, or a bias magnetic field, of more than 16 kA/m (200 Oe) is obtained.

The composition ratios m and n are preferably in the ranges of 52 at %$\leq$m+n$\leq$60 at % and 0.2 at %$\leq$n$\leq$40 at %, when the bias layer 6 is made of an alloy with a composition formula of $Pt_mMn_{100-m-n}Z_n$ (wherein Z represents at least one element selected from the group consisting of Pd, Rh, Ru, Ir and Os).

When m+n is less than 52 at % or more than 60 at %, the crystal lattice of $Pt_mMn_{100-m-n}Z_n$ is hardly rearranged into a $L1_o$ type ordered lattice and does not exhibit antiferromagnetic properties, even by applying the second heat treatment at the heat treatment temperature of 240° C. (513 K). The composition ratios are not preferable since the crystal does not exhibit a unidirectional coupling magnetic field.

The composition ratios n of less than 0.2 at % and more than 40 at % are not preferable since the acceleration effect for ordering the crystal lattice of the antiferromagnetic layer 2, or an effect for enhancing the exchange anisotropic magnetic field becomes poor in the former case, and the exchange anisotropic magnetic field decreases in the latter case.

The preferable ranges of m and n are 52.8 at %$\leq$m+n$\leq$59.2 at % and 0.2 at %$\leq$n$\leq$40 at %, where a magnitude of 16 kA/m (200 Oe) of an exchange anisotropic magnetic field, or a bias magnetic field, is obtained.

When the bias layer 6 is formed of an alloy with a composition formula of $Pt_qMn_{100-q-j}L_j$ (wherein L denotes at least one element selected from the group consisting of Au, Ag, Cr, Ni, Fe, Ar, Xe and Kr), the composition ratios q and j are preferably in the ranges of 52 at %$\leq$q+j$\leq$60 at % and 0.2 at %$\leq$j$\leq$10 at %.

When q+j is less than 52 at % or more than 60 at %, the crystal lattice of $Pt_qMn_{100-q-j}L_j$ is not rearranged into a $L1_o$ ordered lattice and does not exhibit antiferromagnetic properties even by applying the second heat treatment at the heat treatment temperature of 240° C. (513 K). The composition ratios are not preferable since the unidirectional exchange coupling magnetic field is not exhibited.

The composition ratios j of less than 0.2 at % and more than 10 at % are not preferable since the unidirectional exchange coupling magnetic field is not sufficiently improved by adding the element L in the former case, and the unidirectional exchange coupling magnetic field decreases in the latter case.

The more preferable ranges of m and n are 52.8 at %$\leq$m+n$\leq$59.2 at % and 0.2 at %$\leq$n$\leq$40 at %, where a magnitude of more than 16 kA/m (200 Oe) of an exchange anisotropic magnetic field, or a bias magnetic field, is obtained.

When the antiferromagnetic layer 2 and bias layer 6 of the bottom type spin-valve type thin film magnetic element 1 are formed of an alloy with a composition formula of $X_mMn_{100-m}$ (wherein X denotes at least one element selected from the group consisting of Pt, Pd, Ir, Rh, Ru and Os), the composition ratio m of the antiferromagnetic layer 2 and bias layer 6 is preferably in the range of 52 at %$\leq$m$\leq$58 at %.

When m is less than 52 at %, the crystal lattice of $X_mMn_{100-m}$ constituting the antiferromagnetic layer 2 is not rearranged into a $L1_o$ type ordered lattice and does not exhibit antiferromagnetic properties even by applying the first heat treatment at the heat treatment temperature of 240° C. (513 K). The composition ratio is not preferable since the unidirectional exchange coupling magnetic field is not exhibited.

When m is more than 58 at %, the crystal lattice of $X_mMn_{100-m}$ is not rearranged into a $L1_o$ type ordered lattice and does not exhibit antiferromagnetic properties even by applying the second heat treatment at the heat treatment temperature of 245° C. (518 K).

When the antiferromagnetic layer 2 and bias layer 6 are formed of an alloy with a composition formula of $X_mMn_{100-m}$, the composition ratio m of the antiferromagnetic layer 2 and bias layer 6 is preferably in the range of 52 at %$\leq$m$\leq$56.3 at %.

When the composition ratio m is less than 52 at %, the crystal lattice of $X_mMn_{100-m}$ is not rearranged into a $L1_o$ type ordered lattice and does not exhibit antiferromagnetic properties even by applying the second heat treatment at the heat treatment temperature of 240° C. (513 K). The composition ratio is not preferable since the unidirectional exchange coupling magnetic field is not exhibited.

When the composition ratio m of the antiferromagnetic layer 2 and bias layer 6 with a composition formula of $X_mMn_{100-m}$ is in the range of 52 at %$\leq$m$\leq$56.3 at %, an exchange anisotropic magnetic field is generated in the antiferromagnetic layer 2 during the first heat treatment. Since the magnitude of the exchange anisotropic magnetic field of the antiferromagnetic layer 2 is larger than the exchange coupling magnetic field of the bias layer 6 even after applying the second heat treatment, the magnetization direction of the pinned magnetic layer 3 remains unchanged and is fixed relative to the applied signal magnetic field from the magnetic recording medium. This composition ratio is therefore preferable since the magnetization direction of the free magnetic layer 5 can be smoothly changed.

When the antiferromagnetic layer 2 and bias layer 6 are formed of an alloy with a composition formula of $Pt_mMn_{100-m-n}Z_n$ (wherein Z represents at least one element selected from the group consisting of Pd, Ir, Rh, Ru and Os), the composition ratios m and n are preferably in the ranges of 52 at %$\leq$m+n$\leq$58 at % and 0.2 at %$\leq$n$\leq$40 at %.

When the composition ratio m+n is less than 52 at %, the crystal lattice of $Pt_mMn_{100-m-n}Z_n$ is not rearranged into a $L1_o$ type ordered lattice and does not exhibit antiferromagnetic properties even by applying the second heat treatment at the heat treatment temperature of 240° C. (513 K). The composition ratio is not preferable since the unidirectional exchange coupling magnetic field is not exhibited.

When m+n exceeds 58 at %, on the other hand, the crystal lattice of $Pt_mMn_{100-m-n}Z_n$ constituting the antiferromagnetic layer 2 is hardly rearranged into a $L1_o$ type ordered lattice and does not exhibit antiferromagnetic properties even by applying the first heat treatment at the heat treatment temperature of 245° C.

The composition ratios n of less than 0.2 at % and more than 40 at % are not preferable, since the unidirectional exchange coupling magnetic field is not sufficiently improved by adding the element Z in the former case and the unidirectional exchange coupling magnetic field decreases in the latter case.

When the antiferromagnetic layer 2 and bias layer 6 are formed of an alloy represented by a composition formula of $Pt_mMn_{100-m-n}Z_n$, the composition ratios m and n are preferably in the ranges of 52 at %$\leq$m+n$\leq$56.3 at % and 0.2 at %$\leq$n$\leq$40 at %.

When the composition ratio m+n is less than 52 at %, the crystal lattice of $Pt_mMn_{100-m-n}Z_n$ is not rearranged into a $L1_o$ type ordered lattice and does not exhibit antiferromagnetic properties even by applying the second heat treatment at the heat treatment temperature of 240° C. (513 K). The composition ratio is not preferable since the unidirectional exchange coupling magnetic field is not exhibited.

The composition ratios n of less than 0.2 at % and more than 40 at % are not preferable, since the unidirectional exchange coupling magnetic field is not sufficiently improved by adding the element Z in the former case and the unidirectional exchange coupling magnetic field decreases in the latter case.

Accordingly, when the composition ratios of the antiferromagnetic layer 2 and bias layer 6 (m and n) are in the ranges of 52 at %≦m+n≦56.3 at % and 0.2 at %≦n≦40 at %, an exchange anisotropic magnetic field is generated in the antiferromagnetic layer 2 during the first heat treatment, and the magnitude of the exchange anisotropic magnetic field of the antiferromagnetic layer 2 becomes larger than the exchange coupling magnetic field of the bias layer 6 after the second heat treatment. The composition ratios as described above are preferable since the magnetization direction of the pinned magnetic layer 3 remains unchanged and is fixed relative to the applied signal magnetic field from the magnetic recording medium, and the magnetization direction of the free magnetic layer 5 may be smoothly changed.

When the antiferromagnetic layer 2 and bias layer 6 are formed of an alloy with a composition formula of $Pt_q Mn_{100-q-j} L_j$ (wherein L represents at least one element selected from the group consisting of Au, Ag, Cr, Ni, Ne, Ar, Xe and Kr), the composition ratios q and j are preferably in the ranges of 52 at %≦q+j≦58 at % and 0.2 at %≦j≦10 at %.

When the composition ratio q+j is less than 52 at %, the crystal lattice of $Pt_q Mn_{100-q-j} Z_j$ is not rearranged into a $L1_o$ type ordered lattice and does not exhibit antiferromagnetic properties even by applying the second heat treatment at the heat treatment temperature of 240° C. (513 K). The composition ratio is not preferable since the unidirectional exchange coupling magnetic field is not exhibited.

When the composition ratio q+j exceeds 58 at %, on the other hand, the $Pt_q Mn_{100-q-j} L_j$ constituting the antiferromagnetic layer 2 is hardly rearranged into a $L1_o$ type ordered lattice and does not exhibit antiferromagnetic properties even by applying the second heat treatment at the heat treatment temperature of 245° C.

A composition ratios j of less than 0.2 at % and more than 10 at % are not preferable, since the unidirectional exchange coupling magnetic field is not sufficiently improved in the former case, and the magnitude of the unidirectional exchange coupling magnetic field decreases in the latter case.

When the antiferromagnetic layer 2 and bias layer 6 are made of an alloy with a composition formula of $Pt_q Mn_{100-q-j} L_j$, the composition ratios q and j are preferably in the ranges of 52 at %≦q+j≦56.3 at % and 0.2 at %≦j≦10 at %.

When the composition ratio q+j is less than 52 at %, the $Pt_q Mn_{100-q-j} L_j$ constituting the bias layer 6 is hardly rearranged into a $L1_o$ type ordered lattice and does not exhibit antiferromagnetic properties even by applying the second heat treatment at the heat treatment temperature of 240° C. (513 K). The composition ratio is not preferable since the bias layer does not exhibit a unidirectional exchange coupling magnetic field.

The composition ratios j of less than 0.2 at % and more than 10 at % are not preferable since the unidirectional exchange coupling magnetic field is not sufficiently improved by adding the element L in the former case, and the unidirectional exchange coupling magnetic field decreases in the latter case.

Accordingly, when the composition ratios of the antiferromagnetic layer 2 and bias layer 6 (q and j) are in the ranges of 52 at %≦q+j≦56.3 at % and 0.2 at %≦j≦10 at %, an exchange anisotropic magnetic field is generated in the antiferromagnetic layer 2 during the first heat treatment, and the magnitude of the exchange anisotropic magnetic field of the antiferromagnetic layer 2 becomes larger than the exchange coupling magnetic field of the bias layer 6 after the second heat treatment. The composition ratios as described above are preferable since the magnetization direction of the pinned magnetic layer 3 remains unchanged and is fixed relative to the applied signal magnetic field from the magnetic recording medium, and the magnetization direction of the free magnetic layer 5 may be smoothly changed.

When the composition of the antiferromagnetic layer 2 of the bottom type spin-valve type thin film magnetic element 1 is made to be different from the composition of the bias layer 6, for example the Mn concentration of the antiferromagnetic layer 2 is adjusted to be larger than the Mn concentration in the bias layer 6, the difference of the exchange coupling magnetic field between the two sublayers becomes more evident after the first heat treatment, and the magnetization direction of the free magnetic layer 5 may certainly cross at right angle with the magnetization direction of the pinned magnetic layer 3.

When the Mn concentrations in the antiferromagnetic layer 2 and in the bias layer 6 are different with each other, the difference in the exchange anisotropic magnetic field becomes more evident after the second heat treatment. The magnetization direction of the pinned magnetic layer 3 is fixed without any change relative to the applied signal magnetic field from the magnetic recording medium to allow the magnetization direction of the free magnetic layer 5 to be smoothly changed.

Accordingly, it is preferable that the bias layer 6 is formed of an alloy with a composition formula of $X_m Mn_{100-m}$ (wherein X represents at least one element selected from the group consisting of Pt, Pd, Ir, Rh, Ru and Os, and the composition ratio m is in the range of 52 at %≦m≦60 at %), and the antiferromagnetic layer 2 is formed of an alloy with a composition formula of $X_m Mn_{100-m}$ (wherein X represents at least one element selected from the group consisting of Pt, Pd, Ir, Rh, Ru and Os, and the composition ratio m is in the range of 48 at %≦m≦58 at %).

When the composition ratio m in the composition formula of the bias layer 6 is less than 52 at % or more than 60 at %, the crystal lattice of $X_m Mn_{100-m}$ constituting the bias layer 6 is hardly rearranged into a $L1_o$ type ordered lattice and does not exhibit antiferromagnetic properties even by applying the second heat treatment at the heat treatment temperature of 240° C. (513 K). The composition ratio is not preferable since the bias layer does not exhibit a unidirectional exchange coupling magnetic field.

When the composition ratio m in the composition formula of the antiferromagnetic layer 2 is less than 48 at % or more than 58 at %, on the other hand, the crystal lattice of $X_m Mn_{100-m}$ constituting the antiferromagnetic layer 2 is hardly rearranged into a $L1_o$ type ordered lattice and does not exhibit antiferromagnetic properties even by applying the first heat treatment at the heat treatment temperature of 245° C. (518 K). The composition ratio is not preferable since the antiferromagnetic layer does not exhibit a unidirectional exchange coupling magnetic field.

Accordingly, the composition ratio of the antiferromagnetic layer 2 and the composition ratio of the bias layer 6 may be selected from the ranges of 48 at %≦m≦58 at % and 52 at %≦m≦60 at %, respectively, to have different composition ratios with each other, so that the exchange anisotropic magnetic field of the antiferromagnetic layer 2 becomes larger than the exchange anisotropic magnetic field of the bias layer 6 by generating the exchange anisotropic magnetic field in the antiferromagnetic layer 2 after the first heat treatment at the first heat treatment temperature of 245° C., and by applying a smaller external magnetic field than the exchange anisotropic magnetic field of the antiferromagnetic layer 2 during the second heat treatment at the second heat treatment temperature of 220° C. (493 K).

When the composition ranges are made to be different with each other by selecting each composition range satisfying the above conditions, a combination that makes the difference between the exchange coupling magnetic field of the antiferromagnetic layer 2 and exchange anisotropic magnetic field of the bias layer 6 evident during the second heat treatment may be selected and freedom of design increases, as compared with the case when the antiferromagnetic layer 2 and bias layer 6 are made to have the same composition with each other.

When the exchange anisotropic magnetic field of the antiferromagnetic layer 2 is generated during the first heat treatment, and an external magnetic field smaller than the exchange anisotropic magnetic field of the antiferromagnetic layer 2 is applied during the second heat treatment, the magnetization direction of the free magnetic layer 5 can cross the magnetization direction of the pinned magnetic layer 3 while the magnetization direction of the pinned magnetic layer 3 remains tightly fixed, without degrading the exchange anisotropic magnetic field of the antiferromagnetic layer 2 or without changing the magnetization direction.

An exchange anisotropic magnetic field of the bias layer 6 may be generated without degrading the exchange anisotropic magnetic field of the antiferromagnetic layer 2, by setting the second heat treatment temperature to be lower than the first heat treatment temperature.

It is also possible to adjust the exchange anisotropic magnetic field of the antiferromagnetic layer 2 to be larger than the exchange anisotropic magnetic field of the bias layer 6 after the second heat treatment, to fix the magnetization direction of the pinned magnetic layer 3 unchanged relative to the applied signal magnetic field from the magnetic recording medium, and to smoothly change the magnetization direction of the free magnetic layer 5.

A preferable combination of the antiferromagnetic layer 2 and the bias layer 6 comprises an alloy $Pt_mMn_{100-m-n}Z_n$ (wherein Z represents at least one element selected from the group consisting of Pd, Ir, Rh, Ru and Os, and composition ratios m and n are in the ranges of 52 at %$\leq$m+n$\leq$60 at % and 0.2 at %$\leq$n$\leq$40 at %) for the bias layer 6, and an alloy $Pt_mMn_{100-m-n}Z_n$ (wherein Z represents at least one element selected from the group consisting of Pd, Ir, Rh, Ru and Os, and composition ratios m and n are in the ranges of 48 at %$\leq$m+n$\leq$58 at % and 0.2 at %$\leq$n$\leq$40 at %) for the antiferromagnetic layer 2.

When the composition ratio m+n in the bias layer 6 is less than 52 at % or exceeds 60 at %, the crystal lattice of $Pt_mMn_{100-m-n}Z_n$ constituting the bias layer 6 is hardly rearranged into a $L1_o$ type ordered lattice and does not exhibit antiferromagnetic properties even by applying the second heat treatment at the heat treatment temperature of 240° C. (513 K). The composition ratio is not preferable since the bias layer does not exhibit a unidirectional exchange coupling magnetic field.

The composition ratios n in the composition formula of the bias layer 6 of less than 1 at % and more than 40 at % are not preferable, since the unidirectional exchange coupling magnetic field is not improved by adding the element Z in the former case, and the unidirectional exchange coupling magnetic field decreases in the latter case.

When the composition ratio m+n in the composition formula of the antiferromagnetic layer 2 is less than 48 at % or exceeds 58 at %, the crystal lattice of $Pt_mMn_{100-m-n}Z_n$ constituting the antiferromagnetic layer 2 is hardly rearranged into a $L1_o$ type ordered lattice and does not exhibit antiferromagnetic properties even by applying the first heat treatment at the heat treatment temperature of 245° C. The composition ratio is not preferable since the antiferromagnetic layer does not exhibit a unidirectional exchange coupling magnetic field.

A composition ratio n of the composition formula of the antiferromagnetic layer 2 of less than 0.2 at % is not preferable, since the unidirectional exchange coupling magnetic field is not sufficiently improved by adding the element Z.

A composition ratio n of more than 40 at % is also not preferable since the unidirectional exchange coupling magnetic field decreases.

Accordingly, the composition ratio of the antiferromagnetic layer 2 and the composition ratio of the bias layer 6 may be selected from the ranges of 48 at %$\leq$m+n$\leq$58 at % and 52 at %$\leq$m+n$\leq$60 at %, respectively, to have different composition ratios with each other, so that the exchange anisotropic magnetic field of the antiferromagnetic layer 2 becomes larger than the exchange anisotropic magnetic field of the bias layer 6 by generating the exchange anisotropic magnetic field in the antiferromagnetic layer 2 after the first heat treatment at the first heat treatment temperature of 245° C., and by applying a smaller external magnetic field than the exchange anisotropic magnetic field of the antiferromagnetic layer 2 during the second heat treatment at the second heat treatment temperature of 220° C. (493 K).

When the composition ranges are made to be different with each other by selecting each composition range satisfying the above conditions, a combination that makes the difference between the exchange coupling magnetic field of the antiferromagnetic layer 2 and exchange anisotropic magnetic field of the bias layer 6 evident during the second heat treatment may be selected and freedom of design increases, as compared with the case when the antiferromagnetic layer 2 and bias layer 6 are made to have the same composition with each other.

When the exchange anisotropic magnetic field of the antiferromagnetic layer 2 is generated during the first heat treatment and an external magnetic field smaller than the exchange anisotropic magnetic field of the antiferromagnetic layer 2 is applied during the second heat treatment, the magnetization direction of the free magnetic layer 5 can cross the magnetization direction of the pinned magnetic layer 3 while the magnetization direction of the pinned magnetic layer 3 remains tightly fixed, without degrading the exchange anisotropic magnetic field of the antiferromagnetic layer 2 or without changing the magnetization direction.

An exchange coupling magnetic field may be generated without degrading the exchange anisotropic magnetic field of the antiferromagnetic layer by lowering the temperature of the second heat treatment below the temperature of the first heat treatment.

It is also possible to adjust the exchange anisotropic magnetic field of the antiferromagnetic layer 2 to be larger than the exchange anisotropic magnetic field of the bias layer 6 after the second heat treatment, to fix the magnetization direction of the pinned magnetic layer 3 unchanged relative to the applied signal magnetic field from the magnetic recording medium, and to smoothly change the magnetization direction of the free magnetic layer 5.

A preferable combination of the antiferromagnetic layer 2 and bias layer 6 comprises an alloy of $Pt_qMn_{100-q-j}L_j$ (wherein L represents at least one element selected from the group consisting of Au, Ag, Cr, Ni, Ne, Ar, Xe and Kr, and the composition rations q and j are in the ranges of 52 at %≦q+j≦60 at % and 0.2 at %≦j≦10 at %) for the bias layer 6, and an alloy of $Pt_qMn_{100-q-j}L_j$ (wherein L represents at least one element selected from the group consisting of Au, Ag, Cr, Ni, Ne, Ar, Xe and Kr, and the composition rations q and j are in the ranges of 48 at %≦q+j≦58 at % and 0.2 at %≦j≦10 at %) for the antiferromagnetic layer 2.

When the composition ratio q+j in the composition formula of the bias layer 6 is less than 52 at % or exceeds 60 at %, the crystal lattice of $Pt_qMn_{100-q-j}L_j$ constituting the bias layer 6 is hardly rearranged into a $L1_o$ type ordered lattice and does not exhibit antiferromagnetic properties even by applying the second heat treatment at the heat treatment temperature of 240° C. (513 K). The composition ratio is not preferable since the antiferromagnetic layer does not exhibit a unidirectional exchange coupling magnetic field.

A composition ratio j of the composition formula of the bias layer 6 of less than 0.2 at % is not preferable, since the unidirectional exchange coupling magnetic field is not sufficiently improved by adding the element L.

A composition ratio j of exceeding 10 at % is also not preferable since the unidirectional exchange coupling magnetic field decreases.

When the composition ratio q+j of the composition formula of the antiferromagnetic layer 2 is less than 48 at % or exceeds 58 at %, on the other hand, the crystal lattice of $Pt_qMn_{100-q-j}L_j$ constituting the antiferromagnetic layer 2 is hardly rearranged into a $L1_o$ type ordered lattice and does not exhibit antiferromagnetic properties even by applying the first heat treatment at the heat treatment temperature of 245° C. The composition ratio is not preferable since the antiferromagnetic layer does not exhibit a unidirectional exchange coupling magnetic field.

The composition ratios j of the antiferromagnetic layer 2 of less than 0.2 at % and exceeding 10 at % are not preferable since the unidirectional exchange coupling magnetic field is not sufficiently improved in the former case, and the unidirectional exchange coupling magnetic field decreases in the latter case.

Accordingly, the composition ratio of the antiferromagnetic layer 2 and the composition ratio of the bias layer 6 may be selected from the ranges of 48 at %≦q+j≦58 at % and 52 at %≦q+j≦60 at %, respectively, to have different composition ratios with each other, so that the exchange anisotropic magnetic field of the antiferromagnetic layer 2 becomes larger than the exchange anisotropic magnetic field of the bias layer 6 by generating the exchange anisotropic magnetic field in the antiferromagnetic layer 2 after the first heat treatment at the first heat treatment temperature of 245° C., and by applying a smaller external magnetic field than the exchange anisotropic magnetic field of the antiferromagnetic layer 2 after the second heat treatment at the second heat treatment temperature of 220° C. (493 K).

When the composition ranges are made to be different with each other by selecting each composition range satisfying the above conditions, a combination that makes the difference between the exchange coupling magnetic field of the antiferromagnetic layer 2 and exchange anisotropic magnetic field of the bias layer 6 evident during the first and second heat treatments may be selected and freedom of design increases, as compared with the case when the antiferromagnetic layer 2 and bias layer 6 are made to have the same composition with each other.

When the exchange anisotropic magnetic field of the antiferromagnetic layer 2 is generated during the first heat treatment and an external magnetic field smaller than the exchange anisotropic magnetic field of the antiferromagnetic layer 2 is applied during the second heat treatment, the magnetization direction of the free magnetic layer 5 can cross the magnetization direction of the pinned magnetic layer 3 while the magnetization direction of the pinned magnetic layer 3 remains tightly fixed, without degrading the exchange anisotropic magnetic field of the antiferromagnetic layer 2 or without changing the magnetization direction.

It is also possible to adjust the exchange anisotropic magnetic field of the antiferromagnetic layer 2 to be larger than the exchange anisotropic magnetic field of the bias layer 6 after the second heat treatment, to fix the magnetization direction of the pinned magnetic layer 3 unchanged relative to the applied signal magnetic field from the magnetic recording medium, and to smoothly change the magnetization direction of the free magnetic layer 5.

Since the antiferromagnetic layer 2 and bias layer 6 comprises an alloy containing at least one element selected from the group consisting of Pt, Pd, Rh, Ru, Ir, Os, Au, Ag, Cr, Ni, Ne, Ar, Xe and Kr, and Mn in the spin-valve type thin film magnetic element 1, a spin-valve type thin film magnetic element 1 having good temperature characteristics may be obtained.

For example, the blocking temperature of the PtMn alloy is about 380° C., which is higher than the blocking temperature of 150° C. of the FeMn alloy that has been used for the bias layer of the conventional spin-valve type thin film magnetic element.

Accordingly, the magnetic element has good durability when it is attached in a device such as a thin film magnetic head that suffers a high temperature in the device, enabling the magnetic element to be an excellent spin-valve type thin film magnetic element 1 having a small temperature change of the exchange anisotropic magnetic field.

The blocking temperature increases by forming the antiferromagnetic layer 2 with the foregoing materials. The magnetization direction of the pinned magnetic layer 3 can be tightly fixed since a large exchange anisotropic magnetic field is generated in the antiferromagnetic layer 2.

The PtMn alloy having a blocking temperature of 380° C. is preferable for the bias layer 6 and antiferromagnetic layer 2, since the blocking temperature is higher than the blocking temperature of the IrMn alloy of 230° C.

In the method for manufacturing the spin-valve type thin film magnetic element 1, the magnetization direction of the pinned magnetic layer 3 is fixed by the first heat treatment and the magnetization direction of the free magnetic layer 5 is aligned in the direction substantially perpendicular to the magnetization direction of the pinned magnetic layer 3, using an alloy containing at least one element selected from the group consisting of Pt, Pd, Rh, Ru, Ir, Os, Au, Ag, Cr, Ni, Ne, Ar, Xe and Kr, and Mn for the antiferromagnetic layer 2 and bias layer 6, and by taking advantage of the properties of the alloy. Therefore, the magnetization direction of the free magnetic layer 5 may be aligned in the direction substantially perpendicular to the magnetization direction of the pinned magnetic layer 3 without adversely affecting the magnetization direction of the pinned magnetic layer 3, enabling a spin-valve type thin film magnetic element 1 having good heat resistance to be obtained.

When the second heat treatment temperature is adjusted to be lower than the first heat treatment temperature, the exchange anisotropic magnetic field of the antiferromagnetic layer 2 is not degraded by the second heat treatment. In addition, the exchange anisotropic magnetic field generated at the interface between the antiferromagnetic layer 2 and pinned magnetic layer 3 is prevented from decreasing, and the exchange coupling magnetic field bias layer 6 can be generated by the second heat treatment.

While the method for manufacturing the spin-valve type thin film magnetic element 1 using an alloy containing at least one element selected from the group consisting of Pt, Pd, Rh, Ru, Ir, Os, Au, Ag, Cr, Ni, Ne, Ar, Xe and Kr, and Mn for the antiferromagnetic layer 2 and bias layer 6 has been described, only the bias layer 6 may be formed using an alloy containing at least one element selected from the group consisting of Pt, Pd, Rh, Ru, Ir, Os, Au, Ag, Cr, Ni, Ne, Ar, Xe and Kr, and Mn. The bias layer 6 may be also formed using one or more alloys selected from NiO, $\alpha$-$Fe_2O_3$ and CoO.

The magnetic head shown in FIG. 2 has excellent heat resistance by providing the pin-valve type thin film magnetic element on the slider 151. A sufficient magnitude of exchange coupling magnetic field may be obtained at the interface between the bias layer 6 made of an antiferromagnetic material and ferromagnetic layer 7. In addition, the magnitude of pinning magnetic field of the exchange bias is increased to certainly align the magnetization direction of the free magnetic layer 5. Generation of Barkhausen noise may be also prevented. A highly reliable thin film magnetic head may be obtained without distortion of the magnetization direction at both sides of the track portion of the free magnetic layer 5, by preventing abnormal output waveform from generating at both ends of the track width and improving stability of the output waveform.

Magnetic recording errors may be also prevented by reducing gap distortion of the inductive head formed on the upper shield layer 167, or by preventing a large step height from generating. Insulation between the upper shield layer and upper gap layer may be readily ensured to obtain a highly reliable thin film magnetic head.

A giant magnetic resistance change is caused by spin-dependent scattering of conduction electrons appearing at the interface between the non-magnetic conductive layer 4 and pinned magnetic layer 3, and between the on-magnetic conductive layer 4 and free magnetic layer 5. The Co layer is an example that has large spin-dependent scattering in combination with the non-magnetic conductive layer 4 made of Cu. Accordingly, when the pinned magnetic layer 3 is formed using a material other than Co, the non-magnetic conductive layer 4 side of the pinned magnetic layer 3 is preferably formed of a thin Co layer as shown by the broken lines with double dots in FIG. 1. It is also preferable to form the non-magnetic conductive layer 4 side of the free magnetic layer 5 using a thin Co layer as shown by the broken lines with double dots in FIG. 1, when the free magnetic layer 5 is formed of a material other than Co.

[Second Embodiment]

Figure 4:
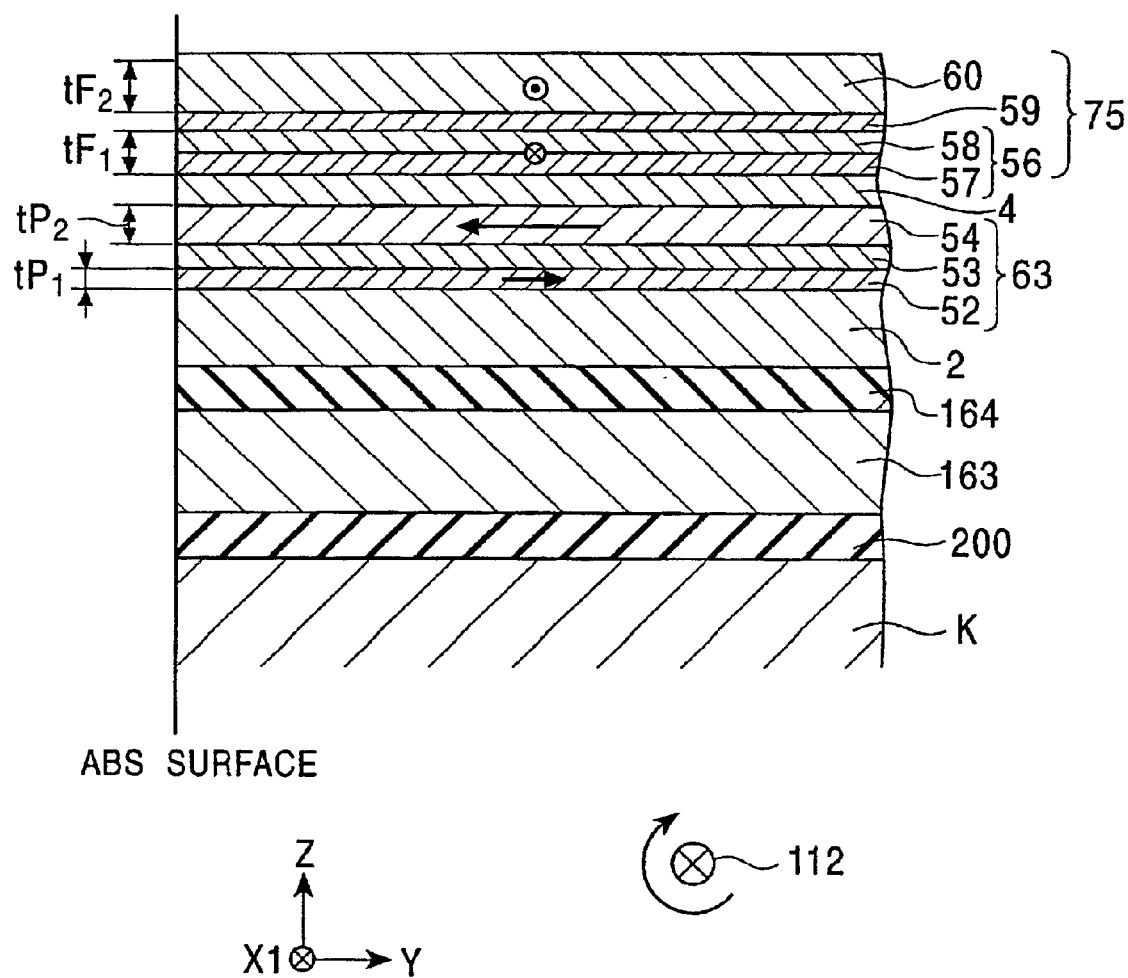
FIG. 4 shows a cross section of the spin-valve type thin film magnetic element in the second embodiment of the present invention.
Figure 5:
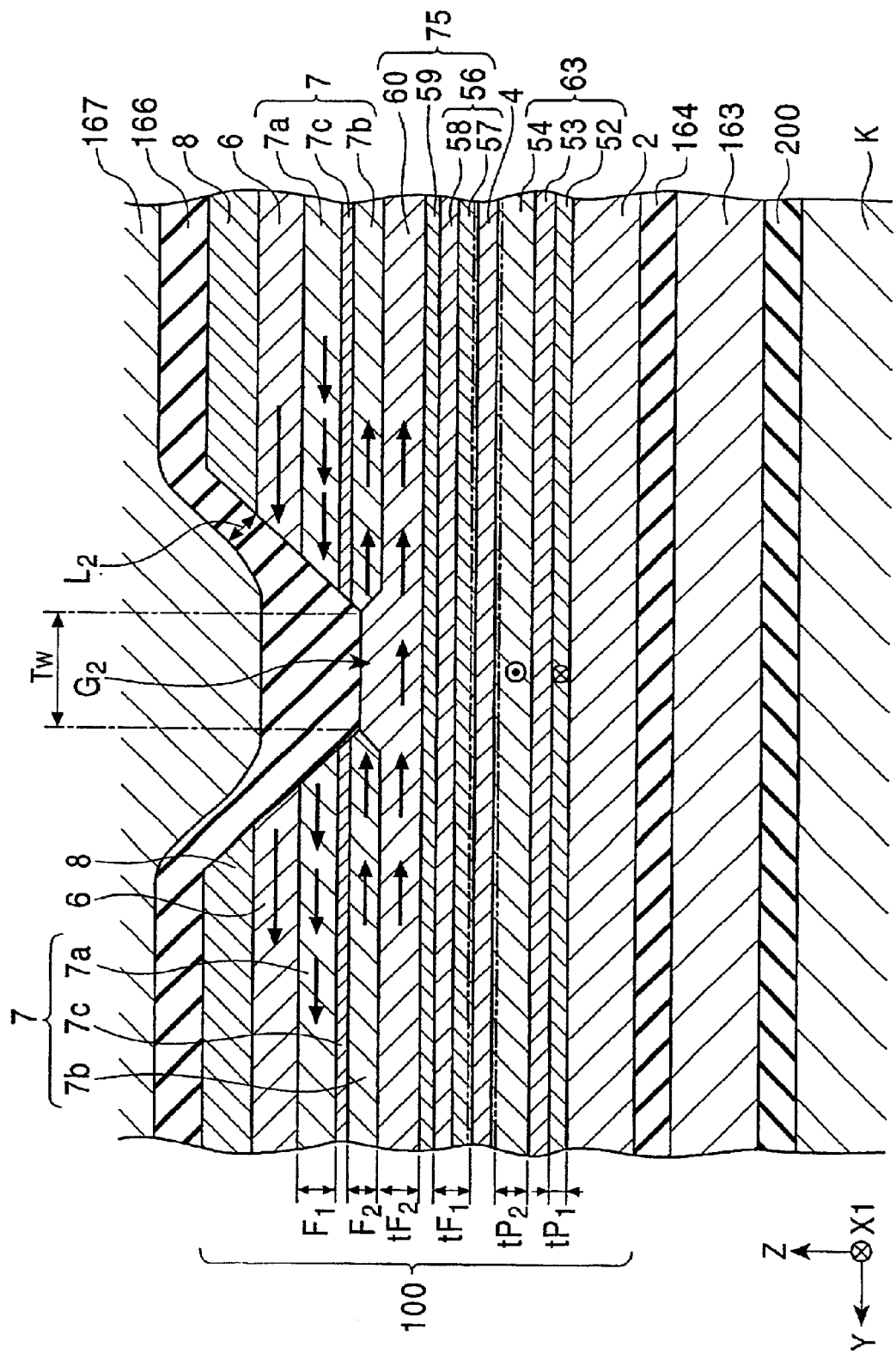
FIG. 5 is a cross section showing the structure of the spin-valve type thin film magnetic element shown in FIG. 4 viewed from the opposed face side to the recording medium.

FIG. 4 is a vertical cross section illustrating the spin-valve type thin film magnetic element according to the second embodiment of the present invention. FIG. 5 is a cross section showing the structure of the spin-valve type thin film magnetic element shown in FIG. 4 viewed from the opposed face side to the recording medium.

This spin-valve type thin film magnetic element 100 is, like the spin-valve type thin film magnetic element 1 shown in FIG. 1, attached at the end of the trailing side 151d of the floating type slider 151 provided in the hard disk device, and senses the recorded magnetic field of the hard disk.

The magnetic recording medium such as the hard disk travels in the Z direction, and the direction of the leakage magnetic field from the magnetic recording medium is along the Y direction.

The spin-valve type thin film magnetic element 100 aligns, like the spin-valve type thin film magnetic element 1 shown in FIG. 1, the magnetization direction of the free magnetic layer 5 in the direction substantially perpendicular to the magnetization direction of the pinned magnetic layer by an exchange bias method using the bias layer 6 made of an antiferromagnetic material.

The spin-valve type thin film magnetic element 100 in this second embodiment differs from the spin-valve type thin film magnetic element 1 shown in FIG. 1 in that a pinned magnetic layer 63 formed by inserting a non-magnetic intermediate layer between first and second pinned magnetic layers 52 and 54 is provided in place of the pinned magnetic layer 3, and that free magnetic layers 75 formed by inserting a non-magnetic intermediate layer 59 between first and second free magnetic layers 56 and 60 is provided in place of the free magnetic layer 5.

The first pinned magnetic layer 52 is in contact with the antiferromagnetic layer 2. The non-magnetic intermediate layer 53 is formed on the first pinned magnetic layer 52, and the second pinned magnetic layer 54 is formed on the non-magnetic intermediate layer 53. The second pinned magnetic layer 54 is in contact with the non-magnetic conductive layer 15.

The first pinned magnetic layer 52 and the second pinned magnetic layer 54 are made of, for example, a Co film, NiFe alloy, CoNiFe alloy, CoNi alloy and CoFe alloy.

The non-magnetic intermediate layer 53 inserted between the first and second pinned magnetic layers 52 and 54 is preferably made of a material containing at least one element selected from the group consisting of Ru, Rh, Ir, Cr, Re and Cu.

The arrows shown in the first and second pinned magnetic layers 52 and 54 in FIGS. 4 and 5 represent the magnitude and direction of magnetic moments in each layer, and the magnitude of the magnetic moment is defined by a product of saturation magnetization (Ms) and film thickness (t).

The first and second pinned magnetic layers 52 and 54 shown in FIGS. 4 and 5 are made of the same material with each other. Since the second pinned magnetic layer 54 is formed to have a larger film thickness $tP_2$ than the film thickness $tP_1$ of the first pinned magnetic layer 52, the second pinned magnetic layer 54 has a larger magnetic moment than that of the first pinned magnetic layer 52.

The first and second pinned magnetic layers 52 and 54 preferably have different magnetic moments with each other. Accordingly, the film thickness $tP_1$ of the first pinned magnetic layer 52 may be larger than the film thickness $tP_2$ of the second pinned magnetic layer 54.

As shown in FIG. 4 and 5, the first pinned magnetic layer 52 is magnetized along the Y axis, or in the direction apart from the recording medium (the height direction). The second pinned magnetic layer 54 facing the first pinned magnetic layer separated by the non-magnetic intermediate layer 53 is magnetized to be antiparallel to the magnetization direction of the first pinned magnetic layer 52.

The first pinned magnetic layer 52 is formed in contact with the antiferromagnetic layer 2, and generates an exchange coupling magnetic field (exchange anisotropic magnetic field) at the interface between the first pinned magnetic layer 52 and antiferromagnetic layer 2 by annealing (heat-treating) in an magnetic field. For example, the magnetization direction of the first pinned magnetic layer 52 is fixed along the Y direction as shown in FIGS. 4 and 5. The magnetization direction of the second pinned magnetic layer 54 facing the first pinned magnetic layer separated by the non-magnetic intermediate layer 53 is pinned to enter an antiparallel-coupling state with the first pinned magnetic layer 52 (a ferrimagnetic state), when the magnetization direction of the first pinned magnetic layer 52 is fixed along the Y direction.

In the spin-valve type thin film magnetic element 100, the magnetization direction of the first pinned magnetic layer 52 may be more certainly maintained to be in the antiparallel-coupling state in relation with the magnetization direction of the second pinned magnetic layer 54 as the magnitude of the exchange coupling magnetic field is larger. The magnetization states of the first and second pinned magnetic layers 52 and 54 can be maintained to be thermally stable in the spin-valve type thin film magnetic element 100 by using the foregoing alloys, which have a high blocking temperature and is able to generate a large exchange coupling magnetic field (exchange anisotropic magnetic field) at the interface between the first pinned magnetic layer and antiferromagnetic layer 2, as the antiferromagnetic layer 2.

In the spin-valve type thin film magnetic element 100, the exchange coupling magnetic field (Hex) may be increased while maintaining the magnetization directions of the first and second pinned magnetic layers 52 and 54 in a thermally stable antiparallel-coupling state (ferrimagnetic state) with each other to obtain a good $\Delta$MR (rate of change of resistance), by restricting the film thickness ratio between the first and second pinned magnetic layers 52 and 54.

The first free magnetic layer 56 is in contact with the non-magnetic conductive layer 4. The non-magnetic intermediate layer 59 is formed on the first free magnetic layer 56, and the second free magnetic layer 60 is additionally formed on the non-magnetic intermediate layer 59. The ferromagnetic layers 7, 7 are formed at both sides on the surface of the second free magnetic layer 60 with a distance corresponding to the track width apart.

The first free magnetic layer comprises two sub-layers as shown in FIG. 4 and 5. A Co film 57 is formed at the side in contact with the non-magnetic conductive layer 4, in order to increase $\Delta$MR and to prevent diffusion to the second non-magnetic conductive layer 4.

A NiFe alloy film 58 is formed on the Co film 57. This NiFe alloy film 58 is in contact with the non-magnetic intermediate layer 59.

The second free magnetic layer 60 is formed of a Co film, a NiFe alloy, a CoFe alloy, a CoNiFe alloy or a CoNi alloy.

The non-magnetic intermediate layer 59 inserted between the first and second free magnetic layers 56 and 60 is preferably formed of at least one element selected from the group consisting Ru, Rh, Ir, Cr, Re and Cu.

The magnetization direction of the first free magnetic layer 56 are aligned to enter the antiparallel-coupling state with the magnetization direction of free second free magnetic layer 60 (ferrimagnetic state) as shown in FIGS. 4 and 5 by the exchange coupling magnetic field (RKKY interaction) generated between the first free magnetic layer 56 and second free magnetic layer 60.

The film thickness $tF_1$ of the first free magnetic layer 56 is adjusted to be smaller than film thickness $tF_2$ of the second free magnetic layer 60 in the spin-valve type thin film magnetic element 100 shown in FIGS. 4 and 5 according to the second embodiment.

$Ms \cdot tF_1$ of the first free magnetic layer 56 is adjusted to be smaller than $Ms \cdot tF_2$ of the second free magnetic layer 56. In this spin-valve type thin film magnetic element 100 according to the second embodiment, magnetization of the second ferromagnetic layers 7b is tightly fixed to be antiparallel to magnetization of the first ferromagnetic layer 7a, or in the direction opposed to the X1 direction in FIG. 1, by tightly fixing magnetization of the first ferromagnetic layers 7b in the X1 direction in FIG. 1 by the large exchange coupling magnetic field (exchange anisotropic magnetic field) generated at the interface between the bias layers 6 and first ferromagnetic layers 7a. Therefore, the first and second ferromagnetic layers 7a and 7b are in a ferrimagnetic state with their magnetization directions entering an antiparallel-coupling state. Since magnetization of the second ferromagnetic layers 7b is tightly fixed in the opposed direction to the X1 direction, the magnitude of the pinning magnetic field of the exchange bias for aligning magnetization of the free magnetic layer 75 to the direction substantially perpendicular to the magnetization direction of the pinned magnetic layer 3 is increased. Consequently, the magnetization direction of the free magnetic layer 60 having large $Ms \cdot tF_2$ is aligned in the direction opposed to the X1 direction by being affected by the pinning magnetic field of the exchange bias, thereby the magnetization direction of the first free magnetic layer 56 having smaller $Ms \cdot tF_1$ is aligned in the X1 direction by the exchange coupling magnetic field (RKKY interaction) with the second free magnetic layer 60.

When an external magnetic field invades from the y direction, the magnetization directions of the first and second free magnetic layers 56 and 60 rotate by being influenced by the external magnetic field while maintaining their ferrimagnetic state. Then, electrical resistance changes by the relationship between the variable magnetization of the first free magnetic layer 56 contributing to $\Delta Mr$ and pined magnetization of the second pinned magnetic layer 54 (for example, magnetized in the direction opposed to the Y direction). As a result, the external magnetic field is sensed as a electrical resistance change.

[Action of Sense Current Magnetic Field]

The action of the sense current magnetic field will be described hereinafter with reference to the structure of the second embodiment shown in FIGS. 4 and 5.

The second pinned magnetic layer 54 is formed under the non-magnetic conductive layer 4 in the spin-valve type thin film magnetic element 100 according to the second embodiment. The direction of the sense current magnetic field is fitted to the magnetization direction of the pinned magnetic layer having a larger magnetic moment of the first and second pinned magnetic layers 52 and 54.

As shown in FIG. 4, the magnetic moment of the second pinned magnetic layer 54 is larger than the magnetic moment of the first pinned magnetic layer 52, and the magnetic moment of the second pinned magnetic layer 54 is directed in the opposed direction to the y direction. Accordingly, the synthetic magnetic moment as a sum of the magnetic moments of the first and second pinned magnetic layers 52 and 54 is directed in the opposed direction to the T direction (the left-side direction in the drawing).

The non-magnetic conductive layer 4 is formed above the second pinned magnetic layer 54 and the first pinned magnetic layer 52 as has been hitherto described. Accordingly, the flow direction of the sense current 112 may be controlled so that the sense current magnetic field formed by the sense current 112 mainly flowing around the center of the non-magnetic conductive layer 4 is directed in the left side below the non-magnetic conductive layer 4. The flow direction of the sense current allows the direction of the synthetic magnetic moment of the first and second pinned magnetic layers 52 and 54 and the direction of the sense current magnetic field to be aligned.

As shown in FIG. 4, the sense current 112 flows in the X1 direction. According to the clockwise rule, the sense current magnetic field formed by flowing the sense current is formed clockwise as viewed from above the drawing. Accordingly, a sense current magnetic field with the direction shown in the drawing (the opposed direction to the Y direction) is applied to the layers below the non-magnetic conductive layers. The sense current enhances the first synthetic magnetic moment and amplifies the exchange coupling magnetic field acting between the first and second pinned magnetic layers 52 and 54 (RKKY interaction), ensuring thermal stability of the antiparallel-coupling state between the magnetization directions of the first and second pinned magnetic layers 52 and 54.

It has been known that a sense current magnetic field of the order of 2.4 kA/m (30 Oe) is generated by flowing 1 mA of the sense current, and the temperate of the element increases by about 10° C. Since a rotation speed of the recording medium of as high as about 10,000 rpm has been used, the temperature in the device increases to about 100° C. in the device due to this increase of the rotation speed. Accordingly, the element temperature of the spin-valve type thin film magnetic element increases to about 200° C. (473 k) by flowing 20 mA of the sense current in addition to increasing the sense current magnetic field up to 24 kA/m (300 Oe).

The magnetic element is placed in a very high temperature environment when a large sense current flows though the element. Consequently, the antiparallel-coupling relationship between the magnetization of the first pinned magnetic layer 52 and magnetization of the second pinned magnetic layer 54 is apt to be collapsed, when the direction of the synthetic magnetic moment as a sum of the magnetic moments of the first and second pinned magnetic layers 52 and 54 and the direction of the sense current magnetic field are in opposed relationship with each other.

For making the magnetic element durable to the high environmental temperature, an antiferromagnetic material having a high blocking temperature should be used for the antiferromagnetic layer 2, besides adjusting the direction of the sense current magnetic field. Accordingly, the foregoing alloys having high blocking temperatures are preferably used in the present invention.

When the synthetic magnetic moment as a sum of the magnetic moments of the first and second pinned magnetic layers 52 and 54 as shown in FIG. 4 is directed in the right-side in the drawing (the Y direction), the sense current magnetic field is controlled to be counterclockwise as viewed from above the drawing by flowing the sense current in the opposed direction to the x1 direction.

According to the embodiment as hitherto described, the direction of the sense current magnetic field formed by flowing the sense current is aligned to the direction of the synthetic magnetic moment as a sum of the magnetic moments of the first and second pinned magnetic layers. Consequently, the exchange coupling magnetic field acting between the first and second pinned magnetic layers (RKKY interaction) is amplified to enable the antiparallel-coupling state (ferrimagnetic state) between magnetization of the first pinned magnetic layer and magnetization of the second pinned magnetic layer to be maintained in a thermally stable state.

In particular, an antiferromagnetic material having a high blocking temperature is used in this embodiment in order to improve thermal stability. As a result, the antiparallel-coupling state between magnetization of the first pinned magnetic layer and magnetization of the second pinned magnetic layer (ferrimagnetic state) is hardly collapsed when the environmental temperature is largely increase as compared with the conventional art.

The sense current magnetic field increases when the amount of the sense current is increased in response to high recording density to enhance the regenerative output. However, the magnetization state of the first and second pinned magnetic layers are more stabilized by increasing the sense current magnetic field in this embodiment, because the sense current magnetic field has an action for amplifying the exchange coupling magnetic field acting between the first and second pinned magnetic layers.

The exchange coupling magnetic field generated at the interface between the bias layer 6 made of an antiferromagnetic material and the ferromagnetic layer 7 in the spin-valve type thin film magnetic element 100 according to the second embodiment, as in the spin-valve type thin film magnetic element 1 according to the first embodiment. Consequently, magnetization direction of the free magnetic layer 75 is certainly aligned in one direction to improve stability of the output waveform at both ends of the track width. In addition, the thickness of the bias layer may be reduced as compared with the bias layer in the conventional spin-valve type thin film magnetic element, when the exchange coupling magnetic field (Hex) generated at the interface between the bias layer 6 and ferromagnetic layer has the same magnitude as in the conventional magnetic element.

[Third Embodiment]

Figure 6:
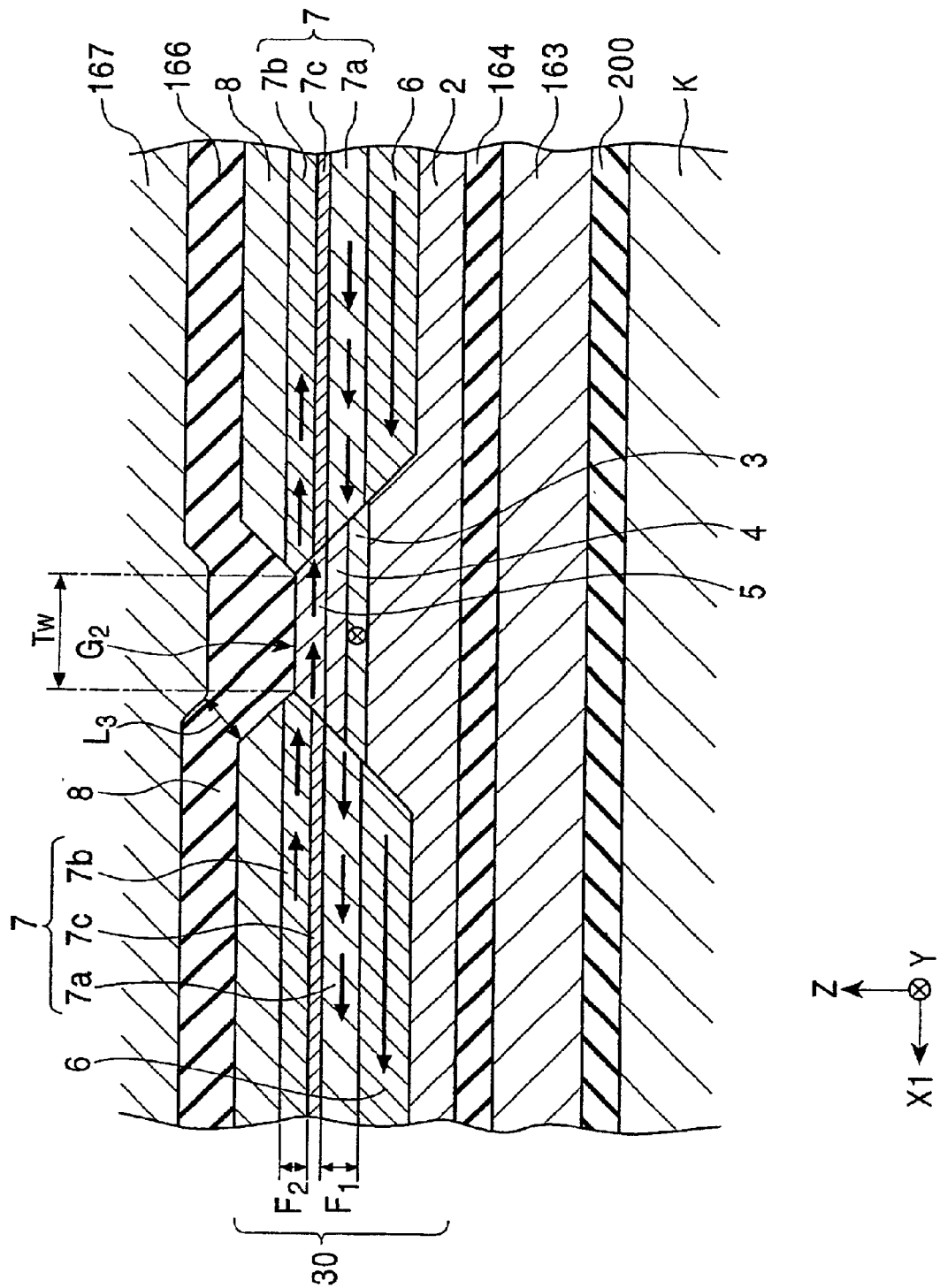
FIG. 6 is a cross section showing the structure of the spin-valve type thin film magnetic element in the third embodiment of the present invention viewed from the opposed face side to the recording medium.

FIG. 6 is a cross section showing the structure of the spin-valve type thin film magnetic element in the third embodiment of the present invention viewed from the opposed face side to the recording medium.

The spin-valve type thin film magnetic element 300 according to the third embodiment, like the spin-valve type thin film magnetic element described above, is attached at the end of the trailing side of the floating type slider provided in the hard disk device to sense the recorded magnetic field from the hard disk.

The magnetic recording medium such as the had disk travels in the Z direction, and the leakage magnetic field from the magnetic recording medium is directed in the Y direction.

The magnetization direction of the free magnetic layer 5 is aligned in the direction substantially perpendicular to the magnetization direction of the pinned magnetic layer by the exchange bas method using the bias layer 6 made of an antiferromagnetic material in the spin-valve type thin film magnetic element 300 according to the third embodiment.

The spin-valve type thin film magnetic element 300 according to the third embodiment differs from the spin-valve type thin film magnetic element 1 shown in FIG. 1 in that, although an antiferromagnetic layer 2, pinned magnetic layer 3, non-magnetic intermediate layer 4 and free magnetic layer 5 are sequentially laminated on the lower gap layer 164, both sides of the laminate is incised along the X1 direction (both sides of the upper layer part of the antiferromagnetic layer 2 is incised along the X1 direction but the lower layer part remains). The bias layers 6, 6 are provided on the antiferromagnetic layer 2 at both sides of the cut-off laminate, or at both sides of the track width direction of the laminate. The ferromagnetic layers 7, 7 are formed on the bias layers 6, 6, and the conductive layers 8, 8 are additionally formed on these ferromagnetic layers 7, 7.

While the non-magnetic intermediate layers 7c are inserted between the first and second ferromagnetic layers 7a, 7b in the ferromagnetic layer 7 of the third embodiment, the first ferromagnetic layers 7a are in contact with the bias layer 6 and the second ferromagnetic layers 7b is in contact with the conductive layer 8.

A large exchange coupling magnetic field (an exchange anisotropic magnetic field) is generated at the interface between the first ferromagnetic layer 7a of the ferromagnetic layer 7 and bias layer 6 in the spin-valve type thin film magnetic element 300. Magnetization of the first ferromagnetic layer 7a is tightly fixed in the X1 direction shown in FIG. 1 by the large exchange coupling magnetic filed (exchange anisotropic magnetic field) generated at the interface between the first pinned magnetic layer 7a and bias layer 6. Tightly fixing the magnetization of the first ferromagnetic layer 7a in the X1 direction allows magnetization of the second ferromagnetic layers 7b to be tightly fixed in the direction in antiparallel relationship to magnetization of the first ferromagnetic layer 7a, or in the direction opposed to the X1 direction. The first and second ferromagnetic layers 7a and 7b are put into a ferrimagnetic state with their magnetization directions entering the antiparallel-coupling state. The magnitude of the pinning magnetic field of the exchange bias for aligning magnetization of the free magnetic layer 5 in the magnetization direction of the pinned magnetic layer 3 increases by tightly fixing magnetization of the second ferromagnetic layer in the direction opposed to the X1 direction. Consequently, the magnetization direction of the free magnetic layer 5 is certainly aligned in the direction opposed to the X1 direction to put the free magnetic layer 5 into a single magnetic domain state.

The bias layer of the spin-valve type thin film magnetic element 300 may be thinner than the bias layer of the conventional spin-valve type thin film magnetic element for obtaining the same magnitude of the exchange coupling magnetic field (the exchange coupling magnetic field generated at the interface between the bias layer and ferromagnetic layer) as that of the conventional spin-valve type thin film magnetic element. For example, the bias layer of the thin film magnetic element 300 may be as thin as 13 nm as compared with the 30 nm of the thickness of the bias layer of the conventional thin film magnetic element. The bias layers 6, 6, the ferromagnetic layers 7, 7 and the conductive layers 8, 8 are formed on he antiferromagnetic layer 2 at both sides of the cut-off laminate, or at both sides of the laminate along the track width direction. Consequently, the conductive layers 8, 8, ferromagnetic layers 7, 7 and bias layers 6, 6 is allowed to shift downward (to the substrate K side). Therefore, the step height formed in the vicinity of the track portion of the upper gap layer 166 may be reduced. As a result, the shape of the magnetic gap of the recording inductive head h₂ laminated on the spin-valve type thin film magnetic element 300 is prevented to be irregular. Therefore, distortion of the magnetic recording pattern due to irregular shape of the recording inductive head h₂ can be avoided to eliminate the causes of regeneration errors.

Since the thickness of the bias layer 6 is reduced in addition to allowing the conductive layers 8, 8, ferromagnetic layers 7, 7 and bias layers 6, 6 to shift downward (in the substrate side K), the step height of the gap layer formed in the vicinity of the track portion can be reduced. Consequently, the distance between the bias layers or conductive layer and the shield layer formed thereon can be increased. In other words, the distance $L_3$ between the conductive layer 8 and the upper shield layer 167 formed on the conductive layer 8 separated by the upper gap layer 166 is made to be larger than the distance $L_2$ between the conductive layer 8 and upper shield layer 167 in the first embodiment. Accordingly, insulation between the shield layer 167 and the spin-valve type thin film magnetic element may be more certainly ensured.

The exchange coupling magnetic field generated at the interface between the bias layers 6 made of an antiferromagnetic material and the ferromagnetic layer is improved in the spin-valve type thin film magnetic element 300 according to the third embodiment, as in the spin-valve type thin film magnetic element 1 according to the first embodiment. As a result, the magnetization direction of the free magnetic layer 75 may be certainly aligned in one direction since the pinning magnetic field of the exchange bias is increased besides more stabilizing the output waveform at both ends of the track width. The thickness of the bias layers can be more reduced in the spin-valve type thin film magnetic element according to this embodiment as compared with the bias layers in the conventional spin-valve type thin film magnetic element for obtaining the same magnitude of the exchange coupling magnetic field (Hex) generated at the interface between the bias layers 6 and ferromagnetic layer 7.

[Fourth Embodiment]

Figure 10:
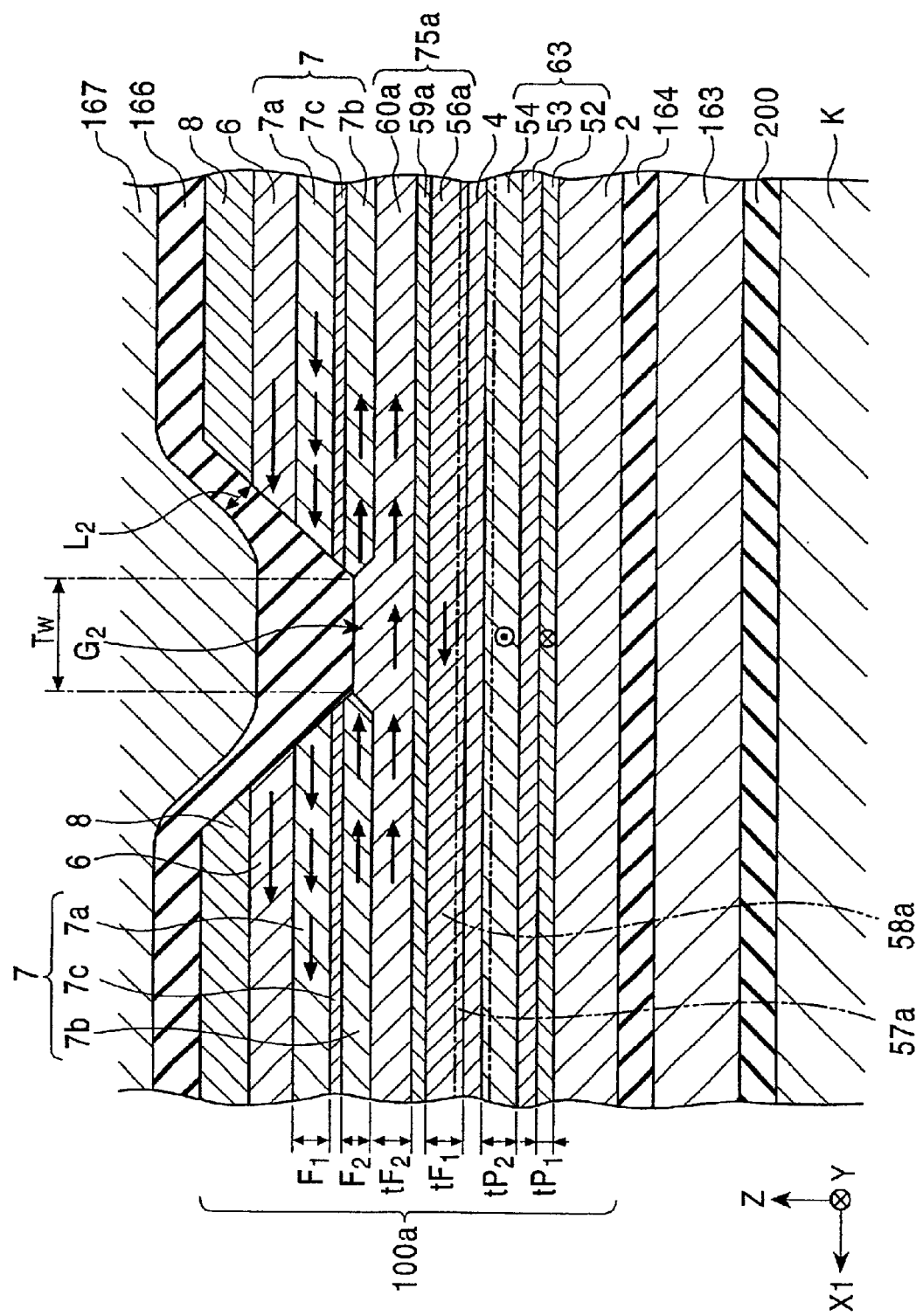
FIG. 10 shows a cross section of the structure of the spin-valve type thin film magnetic element in the fourth embodiment of the present invention viewed from the opposed face side to the recording medium.

FIG. 10 shows a cross section of the structure of the spin-valve type thin film magnetic element in the fourth embodiment of the present invention viewed from the opposed face side to the recording medium.

This spin-valve type thin film magnetic element 100a is, like the spin-valve type thin film magnetic element 100 shown in FIGS. 4 and 5, attached at the end of the trailing side 151d of the floating type slider 151 provided in the hard disk device and senses the recorded magnetic field of the hard disk.

This magnetic recording medium such as the hard disk travels in the Z direction, and the direction of the leakage magnetic field from the magnetic recording medium is along the Y direction.

The spin-valve type thin film magnetic element 100a shown in FIG. 10 aligns, like the spin-valve type thin film magnetic element 100 shown in FIG. 5, the magnetization direction of the free magnetic layer 75 (75a in FIG. 10) in the direction substantially perpendicular to the magnetization direction of the pinned magnetic layer by an exchange bias method using the bias layer 6 made of an antiferromagnetic material.

The spin-valve type thin film magnetic element 100 a in the fourth embodiment differs from the spin-valve type thin film magnetic element 100 of the second embodiment shown in FIG. 5 in that a free magnetic layer 75a made of a specified material is provided in place of the free magnetic layer 75. The structure of this free magnetic layer 75a will be explained in detail in the later section.

The pinned magnetic layer 63 of this embodiment is, like the second embodiment, formed by inserting a non-magnetic intermediate layer 53 between the first and second pinned magnetic layers 52 and 54. The first and second pinned magnetic layers 52 and 54 and the non-magnetic intermediate layer 53 may be made of the same materials as in the second embodiment. Preferably, a CoFe alloy may be used as the material for the first and second pinned magnetic layers 52 and 54, and Ru may be used as the material for the non-magnetic intermediate layer 53. The first pinned magnetic layer 52 is, as in the second embodiment, magnetized in the Y direction in the drawing, or in the direction apart from the recording medium (the height direction). The second pinned magnetic layer 54 facing the first pinned magnetic layer 52 separated by the non-magnetic intermediate layer 53 is magnetized to be antiparallel to the magnetization direction of the first pinned magnetic layer 52 (ferrimagnetic state). The nonmagnetic conductive layer 4 of this embodiment may be made of the same material as that of the second embodiment. Preferably, Cu is used.

The free magnetic layer 75a of this embodiment comprises first and second free magnetic layers 56a and 60a and a non-magnetic intermediate layer 59a a made of Ru disposed therebetween. One face (the lower face in FIG. 10) of the first free magnetic layer (first magnetic layer) 56a is in contact with the non-magnetic conductive layer 4. On the other face (the upper face in FIG. 10) of the first free magnetic layer 56a, the non-magnetic intermediate layer 59a is formed. The second free magnetic layer (second magnetic layer) 60a is formed on this non-magnetic intermediate layer 59a. Ferromagnetic layers 7 are formed at the two sides on the upper face of the second free magnetic layer 60a with a distance corresponding to the track width apart.

Because the non-magnetic intermediate layer 59a of this embodiment is composed of Ru, at least one of the first free magnetic layer 56a and the second free magnetic layer 60a is composed of a CoFeNi alloy. Preferably, the first free magnetic layer 56a is composed of a CoFeNi alloy, and, more preferably, both the first and the second free magnetic layers are composed of a CoFeNi alloy.

The CoFeNi alloy constituting the first and/or the second free magnetic layers 56a and 60a preferably contains 9 to 17 atomic percent of Fe, 0.5 to 10 atomic percent of Ni, and the balance of Co. In this manner, the coercive force (Hc) of the free magnetic layer 75a is controlled to approximately 800 A/m (10 Oe) or less and the magnetostriction ($\lambda$s) is controlled in the range of approximately ($-3\times10^{-6}$) and ($+3\times10^{-6}$), thereby improving the soft magnetic property and readily adjusting the magnetostriction of the free magnetic layer 75a to zero. When the CoFeNi alloy constituting the first and second free magnetic layers 56a and 60a is limited to the above-described composition and the non-magnetic conductive layer 4 is composed of Cu, the diffusion of Cu and Ni contained in the non-magnetic conductive layer is favorably prevented, thereby increasing a rate of change in resistance of the spin-valve type thin film magnetic element.

When the Fe content in the CoFeNi alloy is less than 9 atomic percent, the magnetostriction of the free magnetic layer composed of such a CoFeNi alloy exceeds ($+3\times10^{-6}$), the value $\lambda$s becomes excessively positive resulting in a degraded soft magnetic property, and substantially none of the advantages of using the CoFeNi alloy as the material for the free magnetic layers is achieved. In contrast, when the Fe content exceeds 17 atomic percent, the magnetostriction of the free magnetic layer composed of such a CoFeNi alloy becomes less than ($-3\times10^{-6}$), the value $\lambda$s becomes excessively negative, resulting in a degraded soft magnetic property, and no advantage can be gained from using the CoFeNi alloy as the material for the free magnetic layers.

When the Ni content in the CoFeNi alloy is less than 0.5 atomic percent, the magnetostriction of the free magnetic layer composed of such a CoFeNi alloy becomes less than ($-3\times10^{-6}$), the value $\lambda$s becomes excessively negative, and substantially none of the advantages of using the CoFeNi alloy can be achieved. In contrast, when the Ni content exceeds 10 atomic percent, the magnetostriction of the free magnetic layer composed of this CoFeNi alloy exceeds ($+3\times10^{-6}$), the value $\lambda$s becomes excessively positive, and the rate of change in resistance of the spin-valve type thin film magnetic element and change in resistance are degraded due to the diffusion of Ni and Cu contained in the non-magnetic conductive layer 4, and substantially none of the advantages of using the CoFeNi alloy can be achieved.

In the spin-valve type thin film magnetic element used for the thin-film magnetic head, the magnetostriction of the free magnetic layer 75a is preferably adjusted to zero in order to avoid the variation in characteristics resulting from the variation of the stresses to which the element is exposed, and to improve the stability of the output waveform. In this embodiment, because the non-magnetic intermediate layer 59a is made of Ru, the magnetostriction of the free magnetic layer 75a shifts to the positive side by 1 to 6 ppm when the non-magnetic intermediate layer 59a comes into contact with the first and/or the second free magnetic layer composed of the CoFeNi alloy. The above-described CoFeNi alloy composition is set taking into an account such a shift, so as to adjust the magnetostriction of the free magnetic layer 75a to approximately zero.

The most preferable composition of the CoFeNi alloy constituting the first and/or second free magnetic layers is $Co_{87}Fe_{11}Ni_{2}$.

Figure 12:
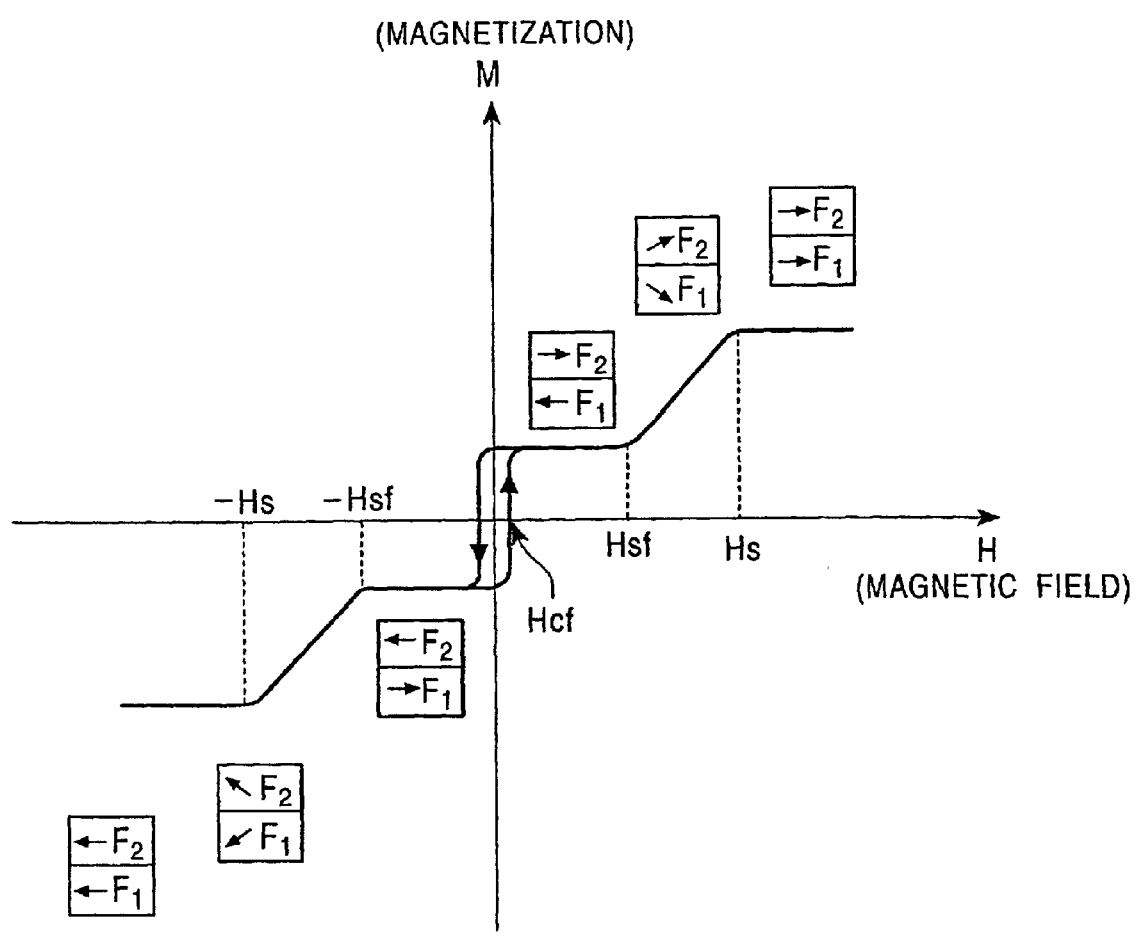
FIG. 12 illustrates an M-H curve of the free magnetic layer of the spin-valve type thin film magnetic element shown in FIG. 10.

FIG. 12 is a schematic M-H curve diagram of the above-described free magnetic layer including the first free magnetic layer and the second free magnetic layer which are separated by the non-magnetic intermediate layer. This M-H curve shows a change in magnetization M of the thin film corresponding to the free magnetic layer 75a (the bias layers etc. are not yet provided) of the spin-valve type thin film magnetic element shown in FIG. 10 when an external magnetic field H is applied to the thin film in the easy axis of magnetization (the track width direction).

In FIG. 12, the arrow $F_1$ indicates the magnetization direction of the first free magnetic layer 56a and the arrow $F_2$ indicates the magnetization direction of the second free magnetic layer 60a.

As shown in FIG. 12, when the external magnetic field H has a small absolute magnitude, the first free magnetic layer 56a and the second free magnetic layer 60a are in an antiferromagnetic coupling state, that is, the arrow $F_1$ and the arrow $F_2$ are antiparallel. When the absolute value of the external magnetic field H exceeds a certain value, the ferrimagnetic state cannot be maintained. This phenomenon is called the spin flop transition. The magnitude of the external magnetic field when the spin flop transition occurs corresponds to the spin flop magnetic field (Hsf), shown in FIG. 12. When the absolute value of the external magnetic field (H) is larger than the spin flop magnetic field, the magnetization direction $F_1$ rotates by 180 degrees. Since both the magnetization directions $F_1$ and $F_2$ are saturated and parallel to each other in the direction of the external magnetic field, the ferrimagnetic state completely disappears. This phenomenon corresponds to the saturation magnetic field (Hs), shown in FIG. 12. When the absolute value of the external magnetic field H is within the spin flop magnetic field (Hsf), the antiparallel coupling state is maintained. When the absolute value of the external magnetic field H is smaller than the saturation magnetic field (Hs), the antiparallel coupling state does not completely disappear. Accordingly, a larger spin flop magnetic field (Hsf) and a larger saturation magnetic field (Hs) expand the rage of the magnetic field in which the free magnetic layer is in a stable ferrimagnetic state, resulting in superior characteristics of the spin-valve type thin film magnetic element.

As shown in FIG. 10, the magnetization directions of the first and second free magnetic layers 56a and 60a are put in an antiparallel-coupling state (ferrimagnetic state) by the exchange coupling magnetic field (RKKY interaction) generated between the first and second free magnetic layers 56a and 60a. Although the non-magnetic intermediate layer is composed of Ru, the antiparallel-coupling state (ferrimagnetic state) is secured because the first free magnetic layer 56a and/or the second free magnetic layer 60a is composed of the CoFeNi alloy.

As in the second embodiment, the film thickness $tF_1$ of the first free magnetic layer 56a is adjusted to be smaller than the film thickness $tF_2$ of the second free magnetic layer 60a in the spin-valve type thin film magnetic element 100a of the fourth embodiment shown in FIG. 10.

$Ms \cdot tF_1$ of the first free magnetic layer 56a is adjusted to be smaller than $Ms \cdot tF_2$ of the second free magnetic layer 60a. In this spin-valve type thin film magnetic element 100a according to the fourth embodiment, because the large exchange coupling magnetic field (exchange anisotropic magnetic field) generated at the interface between the bias layers 6 and the first ferromagnetic layer 7a firmly pins the magnetization direction of the first ferromagnetic layer 7a in the X1 direction in FIG. 10, the magnetization direction of the second ferromagnetic layer 7b is firmly pinned in the direction antiparallel to the magnetization of the first ferromagnetic layer 7a, i.e., the direction opposite to the X1 direction in FIG. 10, thereby putting the magnetization directions of the first and second ferromagnetic layers 7a and 7b in an antiparallel-coupling state, i.e., the ferrimagnetic state. Because the magnetization of the second ferromagnetic layers 7b is securely pinned in the direction opposite to the X1 direction, the magnitude of the pinning magnetic field of the exchange bias for aligning the magnetization of the free magnetic layer 75a in the direction substantially perpendicular to the magnetization direction of the pinned magnetic layer 63 is increased. Consequently, the magnetization direction of the free magnetic layer 60a having large $Ms \cdot tF_2$ is aligned in the direction opposite to the X1 direction by being affected by the pinning magnetic field of the exchange bias, thereby aligning the magnetization direction of the first free magnetic layer 56a having smaller $Ms \cdot tF_1$ in the X1 direction by the exchange coupling magnetic field (RKKY interaction) generated in relation with the second free magnetic layer 60a.

When an external magnetic field is applied from the Y direction in the drawing, the magnetization directions of the first and the second free magnetic layers 56a and 60a rotate by being influenced by the external magnetic field while maintaining their ferrimagnetic state. The electrical resistance then changes according to the relationship between the variable magnetization of the first free magnetic layer 56a contributing to ΔMR and a pinned magnetization (for example, that magnetized in the direction opposite to the Y direction) of the second pinned magnetic layer 54a. As a result, the external magnetic field is sensed as a change in electrical resistance.

In the spin-valve type thin film magnetic element of the fourth embodiment having the above-described configuration, the exchange coupling magnetic field generated at the interface between the bias layers 6 and the ferromagnetic layer 7 composed of an antiferromagnetic material can be increased, as in the spin-valve type thin film magnetic element 100 of the second embodiment. Thus, the pinning magnetic field of the exchange bias can be increased, and the magnetization direction of the free magnetic layer 75 can be securely aligned in one direction, resulting in an improved stability of the output waveform at the two side of the track width. In this respect, the thickness of the bias layers required to achieve the same magnitude of the exchange coupling magnetic field (Hex) generated at the interface between the bias layers 6 and the ferromagnetic layer 7 as that of the conventional spin-valve type thin film magnetic element is reduced.

Moreover, in this embodiment, when the free magnetic layer 75a comprises the first free magnetic layer 56a, the second free magnetic layer 60a, and the non-magnetic intermediate layer 59a composed of Ru disposed between the first and the second free magnetic layer 56a and 60a, the spin-flop magnetic field (Hsf) and saturation magnetic field (Hs) can be increased by forming either one of or both of the first and the second free magnetic layers 56a and 60a by a CoFeNi alloy, compared to the case where a NiFe alloy is used as the material for the first and/or second free magnetic layers. Thus, the magnetization direction of the free magnetic layer can be rotated with high sensitivity while stably maintaining the ferrimagnetic state. Moreover, the soft magnetic property can be improved by keeping the coercive force of the free magnetic layer 75a at a low level, the magnetostriction (λs) can be easily adjusted to approximately zero, and properties required for the thin-film magnetic head can be desirably obtained.

Next, the above-described improvement in the spin-flop magnetic field (Hsf) will be described in detail below.

The spin-valve type thin film magnetic element 100 according to the second embodiment was prepared by forming: the free magnetic layer 75 comprising the first free magnetic layer 56 of $Ni_{80}Fe_{20}$ having a thickness of 1.4 nm, the second free magnetic layer 60 of $Ni_{80}Fe_{20}$ having a thickness of 2.4 nm, and the non-magnetic intermediate layer 59 of Ru disposed between the first and second free magnetic layers 56 and 60; the pinned magnetic layer 63 comprising the first and second pinned magnetic layers 52 and 54 composed of a CoFe alloy and the non-magnetic intermediate layer 53 provided therebetween; and the non-magnetic conductive layer 4 composed of Cu. Hsf thereof was measured and was 59 kA/m.

On the other hand, the spin-valve type thin film magnetic element 100a according to the fourth embodiment was prepared by forming: the free magnetic layer 75 comprising the first free magnetic layer 56a of $Co_{87}Fe_{11}Ni_2$ having a thickness of 1.4 nm, the second free magnetic layer 60a of $Co_{87}Fe_{11}Ni_2$ having a thickness of 2.4 nm, and the non-magnetic intermediate layer 59a composed of Ru provided therebetween; the pinned magnetic layer 63 comprising the first and second pinned magnetic layers 52 and 54 composed of a CoFe alloy and the non-magnetic intermediate layer 53 of Ru provided therebetween; and the non-magnetic conductive layers 4 composed of Cu. The Hsf thereof was 293 kA/m. Thus, when the non-magnetic intermediate layer is composed of Ru and when the first and second free magnetic layers provided at the two sides of the non-magnetic intermediate layer are composed of a CoFeNi alloy, Hs can be significantly increased and the degree of the antiparallel-coupling state (ferrimagnetic state) can be improved compared to the case where the first and second free magnetic layers are composed of NiFe.

Although the spin-valve type thin film magnetic element 100a of the fourth embodiment comprises the free magnetic layer 56a composed of a single magnetic layer, the free magnetic layer 56a may be formed by depositing a CoFe alloy layer 57a and a CoFeNi alloy layer 58a, while forming the CoFe alloy layer 57a at the position contacting the non-magnetic conductive layer 4.

In such a case, the CoFeNi alloy layer 58a preferably contains 7 to 15 atomic percent of Fe, 5 to 15 atomic percent of Ni, and the balance of Co. In this manner, the coercive force (Hc) of the free magnetic layer 75a is approximately 10 Oe (800 A/m) or less and the magnetostriction (λs) is approximately $(-3 \times 10^{-6})$ to $(+3 \times 10^{-6})$. As a result, the soft magnetic property of the free magnetic layer 75a can be improved, and the magnetostriction of the free magnetic layer 75a can be easily adjusted to zero.

When the content of Fe contained in the CoFeNi alloy layer 58a is less than 7 atomic percent, the magnetostriction of the free magnetic layer made of this CoFeNi alloy exceeds $(+3 \times 10^{-6})$, the value λs becomes excessively positive resulting in a degraded soft magnetic property, and substantially none of the advantages of using the CoFeNi alloy as the material for the free magnetic layers can be achieved. In contrast, when the Fe content exceeds 15 atomic percent, the magnetostriction of the free magnetic layer composed of such a CoFeNi alloy becomes less than $(-3 \times 10^{-6})$, the value λs becomes excessively negative, resulting in a degraded soft magnetic property, and substantially none of the advantages of using the CoFeNi alloy can be achieved.

When the Ni content in the CoFeNi alloy is less than 5 atomic percent, the magnetostriction of the free magnetic layer composed of such a CoFeNi alloy becomes less than $(-3 \times 10^{-6})$, the value λs becomes excessively negative, and substantially none of the advantages of using the CoFeNi alloy can be achieved. In contrast, when the Ni content exceeds 15 atomic percent, the magnetostriction of the free magnetic layer composed of this CoFeNi alloy exceeds $(+3 \times 10^{-6})$, the value λs becomes excessively positive, and substantially none of the advantages of using the CoFeNi alloy can be achieved. When the first free magnetic layer 56a is constituted from the CoFe alloy layer 57a contacting the non-magnetic conductive layer 4 and the CoFeNi alloy layer 58a formed on the CoFe alloy layer 57a, the degradation in rate of change in resistance and resistance change of the spin-valve type thin film magnetic element due to the diffusion of Cu in the non-magnetic conductive layer 4 and Ni can be avoided because the CoFe alloy layer 57a is provided between the non-magnetic conductive layer 4 and the CoFeNi alloy layer 58a even when the non-magnetic conductive layer 4 is composed of Cu.

In the spin-valve type thin film magnetic element for the thin-film magnetic head, the magnetostriction of the free magnetic layer 75a is preferably adjusted to zero in order to inhibit the variation of output characteristics due to the variation of stresses the element is exposed to and to improve the stability of the output waveform. In this embodiment, because the non-magnetic intermediate layer 59a is made of Ru, the magnetostriction of the free magnetic layer 75a shifts to the positive side by 1 to 6 ppm when the CoFeNi alloy layer 58a comes into contact with the non-magnetic intermediate layer 59a. Moreover, because the entire magnetostriction of the free magnetic layer 75a is shifted to the negative side due to the inherent negative magnetostriction, a reduced amount of Fe and an increased amount of Ni are contained in the non-magnetic conductive layer 4 compared to the case where the CoFe alloy layer 57a is not formed. The above-described composition is set taking these factors into an account so as to adjust the magnetostriction of the free magnetic layer 75a to approximately zero.

It can be concluded from the above description that when the free magnetic layer 56a is formed of the CoFe alloy layer 57a contacting the non-magnetic conductive layer 4 and the CoFeNi alloy layer 58a deposited on the CoFe alloy layer 57a, the diffusion of the metals contained in the non-magnetic conductive layer and Ni can be prevented and the rate of change in resistance of the spin-valve type thin film magnetic element can be improved even when the non-magnetic conductive layer 4 is composed of Cu.

[Fifth Embodiment]

Figure 11:
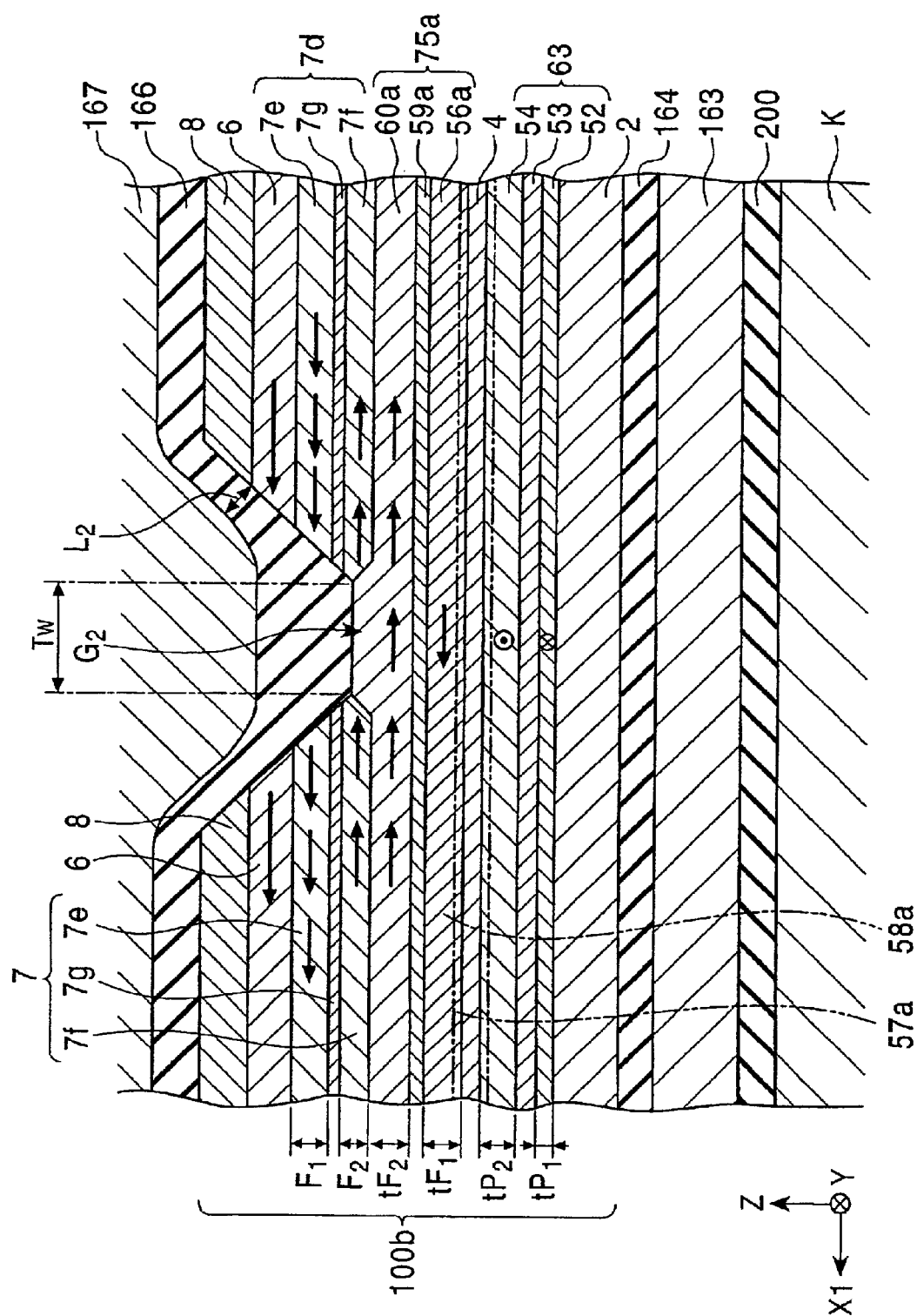
FIG. 11 shows a cross section of the structure of the spin-valve type thin film magnetic element in the fifth embodiment of the present invention viewed from the opposed face side to the recording medium.

FIG. 11 shows a cross section of the structure of the spin-valve type thin film magnetic element in the fifth embodiment of the present invention viewed from the opposed face side to the recording medium.

This spin-valve type thin film magnetic element 100b is, like the spin-valve type thin film magnetic element 100a shown in FIG. 10, attached at the end of the trailing side 151d of the floating type slider 151 provided in the hard disk device and senses the recorded magnetic field of the hard disk.

This magnetic recording medium such as the hard disk travels in the Z direction, and the direction of the leakage magnetic field from the magnetic recording medium is along the Y direction.

The spin-valve type thin film magnetic element 100b shown in FIG. 11 aligns, like the spin-valve type thin film magnetic element 100a shown in FIG. 10, the magnetization direction of the free magnetic layer 75a in the direction substantially perpendicular to the magnetization direction of the pinned magnetic layer by an exchange bias method using the bias layer 6 made of an antiferromagnetic material.

The spin-valve type thin film magnetic element 100b in the fifth embodiment differs from the spin-valve type thin film magnetic element 100a of the fourth embodiment shown in FIG. 10 in that a ferromagnetic layer 7d made of a specified material is provided in place of the ferromagnetic layer 7.

The ferromagnetic layer 7 of this embodiment is divided into two layers, namely, a first ferromagnetic layer (first magnetic layer) 7e and a second ferromagnetic layer (second magnetic layer) 7f, by a non-magnetic intermediate layer 7g composed of Ru. The first ferromagnetic layer 7e is in contact with the bias layers 6. The second ferromagnetic layer 7f opposing the first ferromagnetic layer 7e through the non-magnetic intermediate layer 7g is in contact with the free magnetic layer 75a.

At least one of the first ferromagnetic layer 7e and the second ferromagnetic layer 7f is composed of a CoFeNi alloy. Preferably, both the first ferromagnetic layer 7e and the second ferromagnetic layer 7f are composed of a CoFeNi alloy.

When the surface of the second free magnetic layer 60a is made of a CoFeNi alloy, the second ferromagnetic layer 7f is preferably composed of the CoFeNi alloy. When the second ferromagnetic layer 7f and the second free magnetic layer 60a are composed of the same material, the ferromagnetic coupling at the interface of the second ferromagnetic layer 7f and the second free magnetic layer 60a is assured, and it is possible to transmit the exchange coupling magnetic field generated at the interface between the second ferromagnetic layer 7f and the bias layers 6 to the second free magnetic layer 60a via the second ferromagnetic layer 7f.

The magnetic thicknesses (the product of the saturation magnetization and the layer thickness) of the first and the second ferromagnetic layers 7e and 7f are different from each other. When the first and second ferromagnetic layers 7e and 7f are made of the same material, the thicknesses of the first and the second ferromagnetic layers 7e and 7f are different from each other. In the fifth embodiment, the thickness (magnetic thickness) of the first ferromagnetic layer 7e is set to be slightly larger than the thickness (magnetic thickness) of the second ferromagnetic layer 7f.

In the spin-valve type thin film magnetic element of this embodiment, following advantages can be achieved in addition to the advantages achieved in the spin-valve type thin film magnetic element of the fourth embodiment.

In this embodiment, the ferromagnetic layer 7d is divided into the first and the second ferromagnetic layers 7e and 7f separated by the non-magnetic intermediate layer 7g therebetween, and at least one of the first ferromagnetic layer 7e and the second ferromagnetic layer 7f is composed of a CoFeNi alloy. In this manner, Hsf and Hs are larger compared to the case where a NiFe alloy is used, the magnetization of the ferromagnetic layer 7d can be pinned to enter the stable ferrimagnetic state, and side readings can be securely prevented.

Accordingly, a strong exchange coupling magnetic field (exchange anisotropic magnetic field) generated at the interface between the bias layers 6 and the first ferromagnetic layer 7e contacting the bias layers 6 firmly pins the magnetization of the first ferromagnetic layer 7e in one direction (the X1 direction in the drawing), thereby magnetizing the second ferromagnetic layer 7f opposing the first ferromagnetic layer 7e with the non-magnetic intermediate layer 7e therebetween in a direction antiparallel to the magnetization direction of the first ferromagnetic layer 7e (the direction opposite to the X1 direction in the drawing). Thus, the degree of ferrimagnetic state, i.e., the state in which the magnetization directions of the first and second ferromagnetic layers 7e and 7f are in an antiparallel-coupling state, can be increased.

Because the magnetization direction of the second ferromagnetic layer 7f is firmly pinned in the direction antiparallel to the magnetization direction of the first ferromagnetic layer 7e, the magnitude of the pinning magnetic field, generated by the exchange bias, for orienting the magnetization direction of the free magnetic layer 75a in a direction substantially perpendicular to the magnetization direction of the pinned magnetic layer 63 is increased. Thus, the magnetization direction of the free magnetic layer 63 (particularly the second free magnetic layer 60a) can be securely oriented, and the free magnetic layer 63 (particularly the second free magnetic layer 60a) can readily enter a single magnetic domain state. Accordingly, the ferrimagnetic state between the first and second free magnetic layers 56a and 60a can be improved, the side readings can be prevented, the abnormality in the output waveform at the both sides of the track width can be prevented, and the stability of the output waveform can be improved.

EXAMPLE 1

Figure 7:
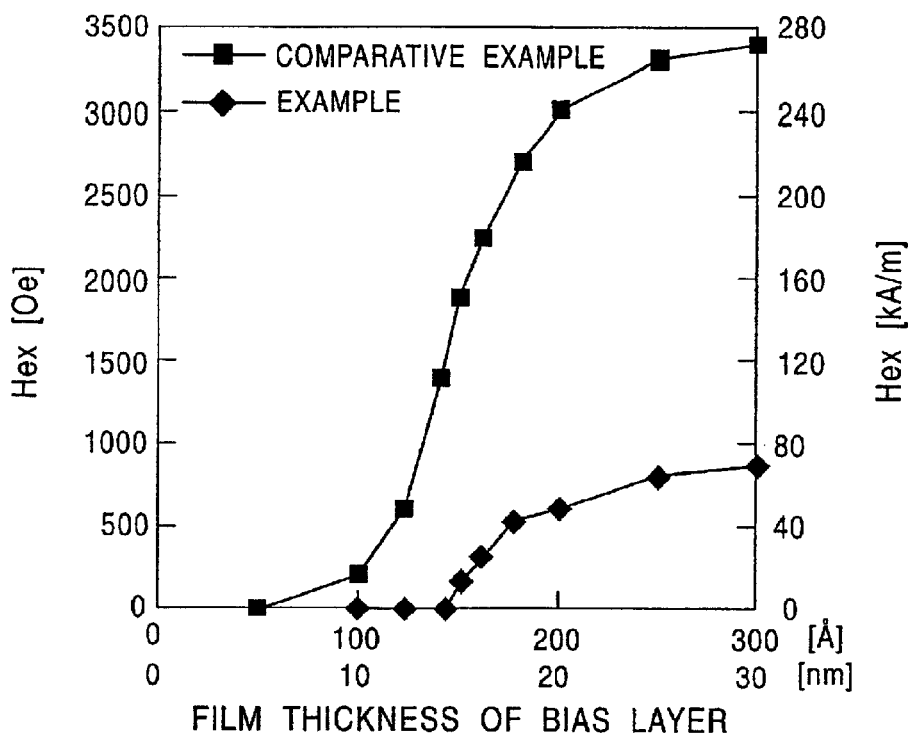
FIG. 7 is a graph showing the relationship between the film thickness of the bias layer and the exchange coupling magnetic field when the film thickness of the bias layer of the spin-valve type thin film magnetic element is changed.

A spin-valve type thin film magnetic element 1 having the same construction as in FIG. 1 was manufactured. The exchange coupling magnetic field (Hex) generated at the interface between the bias layers 6 and the first ferromagnetic layer 7a was measured by changing the film thickness of the bias layers 6 of the thin film magnetic element (the spin-valve type thin film magnetic element in the example) made of PtMn in the range from 50 angstrom (5 nm) to 300 angstrom (30 nm). The results are shown in FIG. 7 and Table 1. Table 1 shows the exchange coupling magnetic field (Hex) when the thickness of the bias layers in the element in this example is changed to 27.1 nm, 12.5 nm and 7.0 nm.

Each material and film thickness for each layer constituting the spin-valve type thin film magnetic element manufactured in this example were as follows:

Antiferromagnetic layer 2 . . . PtMn film, 30 nm

Pinned magnetic layer 3 . . . Co film, 3 nm

Free magnetic layer 5 . . . NiFe film, 5 nm

Second ferromagnetic layer 7b . . . . Co film, 2.5 nm

Non-magnetic intermediate layer 7c . . . Ru film, 0.9 nm

First ferromagnetic layer 7a . . . Co film, 2.0 nm

Bias layers 6 . . . PtMn film, 5 to 30 nm

Conductive layer 8 . . . Au film, 30 nm

Figure 9:
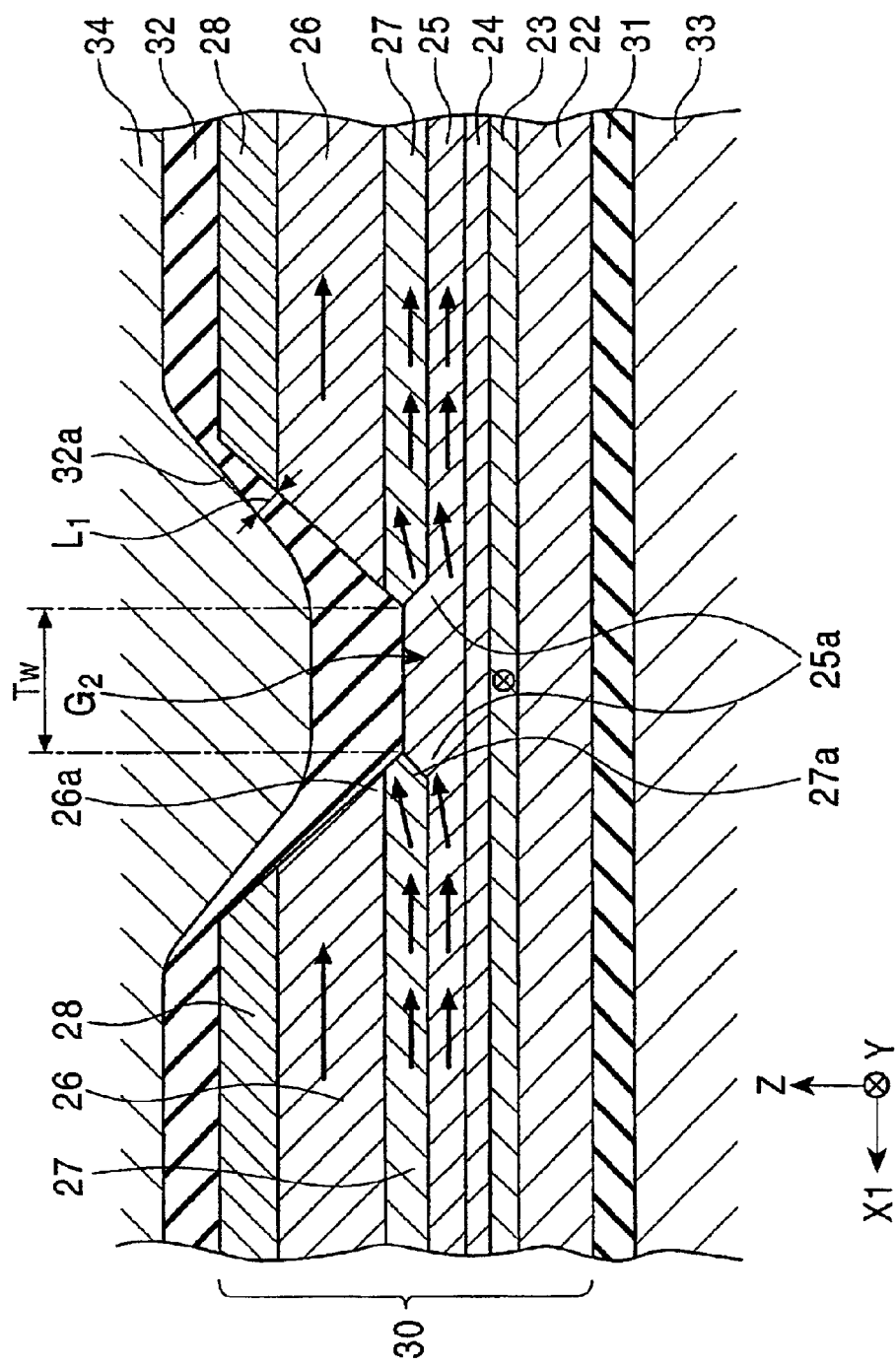
FIG. 9 shows a cross section of the structure of one example of the conventional spin-valve type thin film magnetic element viewed from the opposed face side to the recording medium.

A spin-valve type thin film magnetic element 30 having the same construction as in FIG. 9 was manufactured. The exchange coupling magnetic field (Hex) generated at the interface between the bias layers 26 and the ferromagnetic layer 27 was measured by changing the film thickness of the bias layers 26 of the thin film magnetic element (the spin-valve type thin film magnetic element in the comparative example) made of PtMn in the range from 50 angstrom (5 nm) 300 angstrom (30 nm). The results are also shown in FIG. 7 and Table 1. Table 1 shows the exchange coupling magnetic field (Hex) when the thickness of the bias layers in the element in this example is changed to 30 nm, and 15 nm.

Each material and film thickness for each layer constituting the spin-valve type thin film magnetic element manufactured as a comparative example were as follows:

Antiferromagnetic layer 22 . . . PtMn film, 30 nm

Pinned magnetic layer 23 . . . Co film, 3 nm

Free magnetic layer 55 . . . NiFe film, 5 nm

Ferromagnetic layer 27 . . . Co film, 2.0 nm

Bias layer 26 . . . PtMn film, 5 to 30 nm

Conductive layer 28 . . . Au film, 30 nm

TABLE 1

| FILM CONSTRUCTION | UNIT | EXAMPLE | COMP. EXAMPLE | EXAMPLE | COMP. EXAMPLE | EXAMPLE |
|---|---|---|---|---|---|---|
| THICKNESS OF FIRST FERROMAGNETIC LAYER | (nm) | 2.0 | 0 | 2.0 | 0 | 2.0 |
| THICKNESS OF NON-MAGNETIC INTERMEDIATE LAYER | (nm) | 0.4 | 0 | 0.4 | 0 | 0.4 |
| THICKNESS OF SECOND FERROMAGNETIC LAYER* | (nm) | 2.5 | 2.0 | 2.5 | 2.0 | 2.5 |
| THICKNESS OF BIAS LAYER | (nm) | 27.1 | 30.0 | 12.5 | 15.0 | 7.0 |
| THICKNESS METER | (nm) | 32.0 | 32.0 | 17.4 | 17.0 | 11.9 |
| Hex(EXCHANGE COUPLING MAGNETIC FIELD) | (kA/m) | 268 | 68 | 68 | 12 | 12 |

*The number of the ferromagnetic layer between the bias layers and free magnetic layer in the comparative example is one layer.

The results in FIG. 7 and Table 1 show that a larger exchange coupling magnetic field is obtained in the spin-valve type thin film magnetic element in the example as compared with the spin-valve type thin film magnetic element in the comparative example irrespective of the thickness of the bias layers, wherein the ferromagnetic layer between the free magnetic layer and bias layers is constructed by inserting the non-magnetic intermediate layer between the first and second ferromagnetic layers in the spin-valve type thin film magnetic element in the example, and the ferromagnetic layer between the free magnetic layer and bias layers is composed of a monolayer of a soft magnetic material in the spin-valve type thin film magnetic element in the comparative example. A magnitude of 268 kA/m (3350 Oe) of the exchange coupling magnetic field is obtained in the spin-valve type thin film magnetic element even when the thickness of the bias layers is 30 nm (300 angstrom). In contrast, a magnitude of only 68 kA/m (850 Oe) of the exchange coupling magnetic field is obtained at the thickness of the bias layers of 30 nm (300 angstrom) in the spin-valve type thin film magnetic element in the comparative example. Accordingly, the magnetic element in the example is able to increase the pinning magnetic field of the exchange bias to certainly align the magnetization direction of the free magnetic layer in one direction.

Only 12.5 nm of the thickness of the bias layers is needed in the spin-valve type thin film magnetic element for obtaining 68 kA/m (850 Oe) of the exchange coupling magnetic field that is the same magnitude as that obtained in the spin-valve type thin film magnetic element in the comparative example. In contrast, the spin-valve type thin film magnetic element in the comparative example requires 30 nm in thickens of the bias layers for obtaining 68 kA/m (850 Oe) of the exchange coupling magnetic field. Only 7.0 nm of the thickness of the bias layers is needed in the spin-valve type thin film magnetic element in this example for obtaining 12 kA/m (150 Oe) of the exchange coupling magnetic field that is the same magnitude as that obtained in the spin-valve type thin film magnetic element in the comparative example. In contrast, the spin-valve type thin film magnetic element in the comparative example requires 17 nm in thickens of the bias layers for obtaining 12 kA/m (150 Oe) of the exchange coupling magnetic field. Since the thickness of the bias layers of the spin-valve type thin film magnetic element in the example may be reduced for obtaining the same magnitude of the exchange coupling magnetic field as will be obtained in the spin-valve type thin film magnetic element, the step height formed in the vicinity of the track portion of the gap layer on the element can be reduced.

EXAMPLE 2

Figure 8:
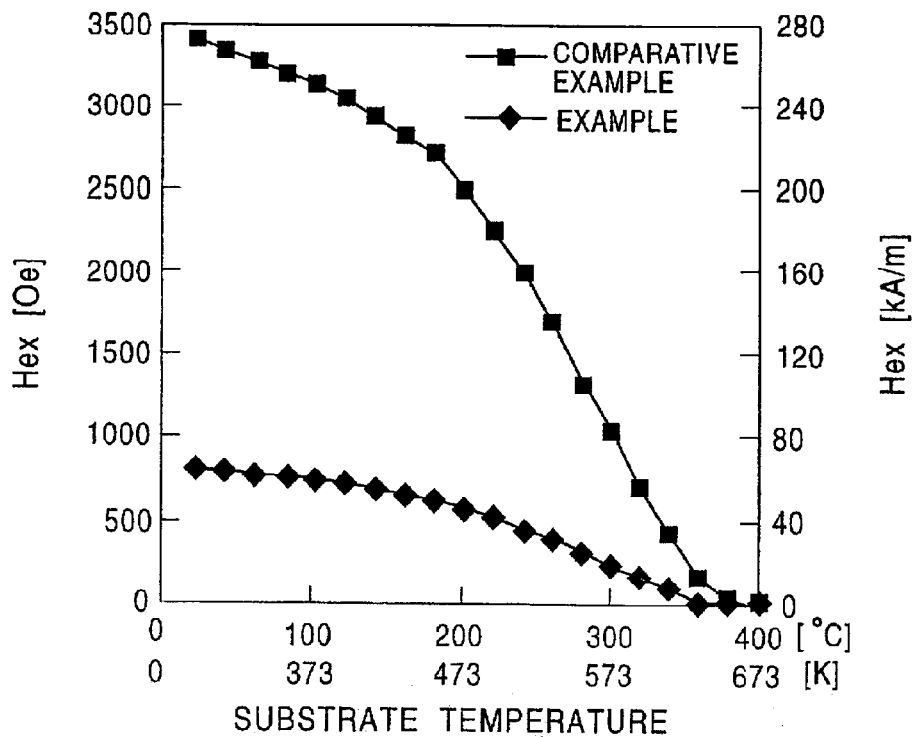
FIG. 8 is a graph showing the relationship between the substrate temperature and exchange coupling magnetic field when the temperature applied to the substrate having a thin film corresponding to a spin-valve type thin film annealed in advance is changed.

A spin-valve type thin film magnetic element 1 having the same structure as that shown in FIG. 1 was formed on a substrate and was then annealed. After annealing, the temperature of the heat applied to the substrate was changed in the range from 0° C. (273 K) to 400° C. (673 K). The exchange coupling magnetic field (Hex) generated at the interface between the bias layers 6 and first ferromagnetic layer 7a was measured according to the temperatures. The results are shown in FIG. 8.

Each material and film thickness for each layer constituting the spin-valve type thin film magnetic element manufactured in this example were as follows:

Antiferromagnetic layer 2 . . . PtMn film, 30 nm
Pinned magnetic layer 3 . . . Co film, 3 nm
Free magnetic layer 5 . . . NiFe film, 5 nm
Second ferromagnetic layer 7b . . . Co film, 2.5 nm
Non-magnetic intermediate layer 7c . . . Ru film, 0.9 nm
First ferromagnetic layer 7a . . . Co film, 2.0 nm
Bias layer 6 . . . PtMn film, 5 to 30 nm
Conductive layer 8 . . . Au film, 30 nm For the comparative purpose, a spin-valve type thin film magnetic element 3 having the same structure as that shown in FIG. 9 was formed on a substrate and was annealed. After annealing, the temperature of the heat applied to the substrate was changed in the range from 0° C. (273 K) to 400° C. (673 K). The exchange coupling magnetic field (Hex) generated at the interface between the bias layers 6 and first ferromagnetic layer 7a was measured according to the temperatures. The results are also shown in FIG. 8.

Each material and film thickness for each layer constituting the spin-valve type thin film magnetic element manufactured in this example were as follows:

Antiferromagnetic layer 22 . . . PtMn film, 30 nm
Pinned magnetic layer 23 . . . Co film, 3 nm
Free magnetic layer 55 . . . NiFe film, 5 nm
Ferromagnetic layer 27 . . . Co film, 2.0 nm
Bias layer 26 . . . PtMn film, 5 to 30 nm
Conductive layer 28 . . . Au film, 30 nm The results shown in FIG. 8 shows that an exchange coupling magnetic field larger than that obtained in the spin-valve type thin film magnetic element in the comparative example is obtained in the spin-valve type thin film magnetic element in the example in which the substrate temperature is in the range from 0° C. (273 K) to 400° C. (673 K). An exchange coupling magnetic field with a magnitude exceeding 13.6 kA/m (175 Oe) is also obtained in the thin film magnetic element in the example in which the substrate temperature is 250° C. (523 K). Accordingly, in the spin-valve type thin film magnetic element of this embodiment, the exchange coupling magnetic field under a high temperature environment degraded less compared to spin-valve type thin film magnetic element for comparison and thus has superior heat resistance.

It is possible for the spin-valve type thin film magnetic element to change the magnitude of the exchange coupling magnetic field generated between the bias layer and first ferromagnetic layer to a preferable magnitude by changing the heat treatment temperature.

What is claimed is:

1. A spin-valve type thin film magnetic element comprising:

a laminate comprising an antiferromagnetic layer, a pinned magnetic layer in contact with an antiferromagnetic layer in which the magnetization direction of the pinned magnetic layer is fixed by an exchange anisotropic magnetic field with the antiferromagnetic layer, and a non-magnetic conductive layer formed between the pinned magnetic layer and a free magnetic layer;

bias layers for aligning the magnetization direction of the free magnetic layer in the direction substantially perpendicular to the magnetization direction of the pinned magnetic layer;

ferromagnetic layers formed in contact with the bias layers; and conductive layers for applying a sensing current to the free magnetic layer, wherein each of the ferromagnetic layers is divided into two sub-layers separated by a first non-magnetic intermediate layer, the sub-layers being in a ferrimagnetic state in which the magnetization direction of one sub-layer is 180 degrees different from the magnetization direction of the other sub-layer, and wherein the free magnetic layer is divided into two sub-layers separated by a second non-magnetic intermediate layer, the sublayers being in a ferrimagnetic state in which the magnetization direction of one sub-layer is 180 degrees different from the magnetization direction of the other sub-layer, and wherein the bias layers comprise at least one material selected from the group consisting of α-Fe$_2$O$_3$ and CoO, and wherein the antiferromagnetic layer comprises an alloy containing at least one element selected from the group of Pt, Pd, Rh, Fe, Ru, Ir, Os, Au, Ag, Cr, Ni, Ne, Ar, Xe and Kr, and Mn.

2. The spin-valve type thin film magnetic element according to claim 1, wherein ferromagnetic layers are disposed on the free magnetic layer with a distance corresponding to a track width, the bias layers being provided on the ferromagnetic layers and the conductive layers being provided on the bias layers.

3. The spin-valve type thin film magnetic element according to claim 1, wherein the bias layers are provided at both sides in the track width direction of the laminate, the ferromagnetic layers being provided on the bias layers and the conductive layers being provided on the ferromagnetic layers.

4. The spin-valve type thin film magnetic element according to claim 1, wherein the ferromagnetic layer comprises at least one element selected from the group consisting of Ni, Fe and Co.

5. The spin-valve type thin film magnetic element according to claim 1, wherein the bias layers comprise an alloy containing at least one element selected from the group consisting of Pt, Pd, Rh, Fe, Ru, Ir, Os, Au, Ag, Cr, Ni, Ne, Ar, Xe and Kr, and Mn.

6. The spin-valve type thin film magnetic element according to claim 1, wherein the bias layers comprise an antiferromagnetic material.

7. The spin-valve type thin film magnetic element according to claim 6, wherein the antiferromagnetic material has a lower heat treatment temperature than that of the antiferromagnetic layer.

8. The spin-valve type thin film magnetic element according to claim 1, wherein the free magnetic layer comprises a first free magnetic layer and a second free magnetic layer which are separated by the second non-magnetic intermediate layer, the first free magnetic layer and the second free magnetic layer are in a ferrimagnetic state in which the magnetization direction of the first free magnetic layer is 180 degrees different from the magnetization direction of the second free magnetic layer, at least one of the first free magnetic layer and the second free magnetic layer comprise a CoFeNi alloy, and the second non-magnetic intermediate layer comprises Ru.

9. The spin-valve type thin film magnetic element according to claim 1, wherein the ferromagnetic layer comprises a first ferromagnetic layer and a second ferromagnetic layer which are separated by the first non-magnetic intermediate layer, the first ferromagnetic layer and the second ferromagnetic layer are in a ferrimagnetic state in which the magnetization direction of the first ferromagnetic layer is 180 degrees different from the magnetization direction of the second ferromagnetic layer, at least one of the first ferromagnetic layer and the second ferromagnetic layer comprise a CoFeNi alloy, and the first non-magnetic intermediate layer comprises Ru.

10. The spin-valve type thin film magnetic element according to claim 9, wherein both the first ferromagnetic layer and the second ferromagnetic layer comprise the CoFeNi alloy.

11. A spin-valve type thin film magnetic element comprising:

a laminate comprising an antiferromagnetic layer, a pinned magnetic layer in contact with an antiferromagnetic layer in which the magnetization direction of the pinned magnetic layer is fixed by an exchange anisotropic magnetic field with the antiferromagnetic layer, and a non-magnetic conductive layer formed between the pinned magnetic layer and a free magnetic layer;

bias layers for aligning the magnetization direction of the free magnetic layer in the direction substantially perpendicular to the magnetization direction of the pinned magnetic layer;

ferromagnetic layers formed in contact with the bias layers; and conductive layers for applying a sensing current to the free magnetic layer, wherein each of the ferromagnetic layers is divided into two sub-layers separated by a first non-magnetic intermediate layer, the sub-layers being in a ferrimagnetic state in which the magnetization direction of one sub-layer is 180 degrees different from the magnetization direction of the other sub-layer, and wherein the free magnetic layer comprises a first free magnetic layer and a second free magnetic layer which are separated by the second non-magnetic intermediate layer, the first free magnetic layer and the second free magnetic layer are in a ferrimagnetic state in which the magnetization direction of the first free magnetic layer is 180 degrees different from the magnetization direction of the second free magnetic layer, the first free magnetic layer is disposed between the non-magnetic conductive layer and the second non-magnetic intermediate layer, the first free magnetic layer comprises a CoFeNi alloy, and the second non-magnetic intermediate layer comprises Ru.

12. A spin-valve type thin film magnetic element comprising:

a laminate comprising an antiferromagnetic layer, a pinned magnetic layer in contact with an antiferromagnetic layer in which the magnetization direction of the pinned magnetic layer is fixed by an exchange anisotropic magnetic field with the antiferromagnetic layer, and a non-magnetic conductive layer formed between the pinned magnetic layer and a free magnetic layer;

bias layers for aligning the magnetization direction of the free magnetic layer in the direction substantially perpendicular to the magnetization direction of the pinned magnetic layer;

ferromagnetic layers formed in contact with the bias layers; and conductive layers for applying a sensing current to the free magnetic layer, wherein each of the ferromagnetic layers is divided into two sub-layers separated by a first non-magnetic intermediate layer, the sub-layers being in a ferrimagnetic state in which the magnetization direction of one sub-layer is 180 degrees different from the magnetization direction of the other sub-layer, and wherein the free magnetic layer comprises a first free magnetic layer and a second free magnetic layer which are separated by the second non-magnetic intermediate layer, the first free magnetic layer and the second free magnetic layer are in a ferrimagnetic state in which the magnetization direction of the first free magnetic layer is 180 degrees different from the magnetization direction of the second free magnetic layer, the first free magnetic layer is disposed between the non-magnetic conductive layer and the second non-magnetic intermediate layer, both the first free magnetic layer and the second free magnetic layer comprise the CoFeNi alloy, and the second non-magnetic intermediate layer comprises Ru.

13. A spin-valve type thin film magnetic element comprising:

a laminate comprising an antiferromagnetic layer, a pinned magnetic layer in contact with an antiferromagnetic layer in which the magnetization direction of the pinned magnetic layer is fixed by an exchange anisotropic magnetic field with the antiferromagnetic layer, and a non-magnetic conductive layer formed between the pinned magnetic layer and a free magnetic layer;

bias layers for aligning the magnetization direction of the free magnetic layer in the direction substantially perpendicular to the magnetization direction of the pinned magnetic layer;

ferromagnetic layers formed in contact with the bias layers; and conductive layers for applying a sensing current to the free magnetic layer, wherein each of the ferromagnetic layers is divided into two sub-layers separated by a first non-magnetic intermediate layer, the sub-layers being in a ferrimagnetic state in which the magnetization direction of one sub-layer is 180 degrees different from the magnetization direction of the other sub-layer, and wherein the free magnetic layer comprises a first free magnetic layer and a second free magnetic layer which are separated by the second non-magnetic intermediate layer, the first free magnetic layer and the second free magnetic layer are in a ferrimagnetic state in which the magnetization direction of the first free magnetic layer is 180 degrees different from the magnetization direction of the second free magnetic layer, the first free magnetic layer is disposed between the non-magnetic conductive layer and the second non-magnetic intermediate layer, at least one of the first free magnetic layer and the second free magnetic layer comprise a CoFeNi alloy, the CoFeNi alloy comprises 9 to 17 atomic percent Fe, 0.5 to 10 atomic percent Ni, and the balance being Co, and the second non-magnetic intermediate layer comprises Ru.

14. A spin-valve type thin film magnetic element comprising:

a laminate comprising an antiferromagnetic layer, a pinned magnetic layer in contact with an antiferromagnetic layer in which the magnetization direction of the pinned magnetic layer is fixed by an exchange anisotropic magnetic field with the antiferromagnetic layer, and a non-magnetic conductive layer formed between the pinned magnetic layer and a free magnetic layer;

bias layers for aligning the magnetization direction of the free magnetic layer in the direction substantially perpendicular to the magnetization direction of the pinned magnetic layer;

ferromagnetic layers formed in contact with the bias layers; and conductive layers for applying a sensing current to the free magnetic layer, wherein each of the ferromagnetic layers is divided into two sub-layers separated by a first non-magnetic intermediate layer, the sub-layers being in a ferrimagnetic state in which the magnetization direction of one sub-layer is 180 degrees different from the magnetization direction of the other sub-layer, and wherein the free magnetic layer comprises a first free magnetic layer and a second free magnetic layer which are separated by the second non-magnetic intermediate layer, the first free magnetic layer and the second free magnetic layer are in a ferrimagnetic state in which the magnetization direction of the first free magnetic layer is 180 degrees different from the magnetization direction of the second free magnetic layer, the first free magnetic layer is disposed between the non-magnetic conductive layer and the second non-magnetic intermediate layer, the first free magnetic layer comprises a laminate of a CoFe alloy film and a CoFeNi alloy film, and the CoFe alloy film is formed at the non-magnetic conductive layer side, and the second non-magnetic intermediate layer comprises Ru.

15. The spin-valve type thin film magnetic element according to claim 14, wherein the second free magnetic layer comprises the CoFeNi alloy.

16. The spin-valve type thin film magnetic element according to claim 14, wherein the CoFeNi alloy film comprises 9 to 17 atomic percent Fe, 0.5 to 10 atomic percent Ni, and the balance being Co.

* * * * *

UNITED STATES PATENT AND TRADEMARK OFFICE
CERTIFICATE OF CORRECTION

PATENT NO.    : 6,856,494 B2
DATED         : February 15, 2005
INVENTOR(S)   : Masahiro Ooshima et al.

It is certified that error appears in the above-identified patent and that said Letters Patent is hereby corrected as shown below:

<u>Title page,</u>
Item [75], Inventors, after "Kenichi Tanaka," delete "Tokyo" and substitute
-- Niigata-ken -- in its place.

<u>Column 46,</u>
Line 65, after "sub-layer, and" start a new paragraph with the words "wherein the free".

Signed and Sealed this

Twenty-fourth Day of May, 2005

JON W. DUDAS
*Director of the United States Patent and Trademark Office*